(12) United States Patent
Nishiyama et al.

(10) Patent No.: US 6,326,670 B1
(45) Date of Patent: Dec. 4, 2001

(54) SEMICONDUCTOR DEVICE AND METHOD FOR MANUFACTURING THE SAME

(75) Inventors: Akira Nishiyama; Masahiro Koike, both of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,593

(22) Filed: Mar. 10, 2000

(30) Foreign Application Priority Data

Mar. 11, 1999 (JP) .................................................. 11-064168

(51) Int. Cl.⁷ ..................... H01L 31/119; H01L 23/58; H01L 27/01
(52) U.S. Cl. ..................... 257/411; 257/410; 257/406; 257/368; 257/369; 257/388
(58) Field of Search ..................... 257/405, 406, 257/407, 410, 411, 412, 295, 296, 368, 369, 388; 438/287, 785, 957, 968, 977, 978, 981

(56) References Cited

U.S. PATENT DOCUMENTS

| | | | |
|---|---|---|---|
| 3,925,107 | * 12/1975 | Gdula et al. ......................... | 438/471 |
| 4,954,855 | * 9/1990 | Mimura et al. ...................... | 257/61 |
| 5,308,998 | * 5/1994 | Yamazaki et al. ................... | 257/57 |
| 5,510,640 | * 4/1996 | Shindo ................................ | 257/347 |
| 5,541,131 | * 7/1996 | Yoo et al. ........................... | 438/305 |
| 5,688,724 | * 11/1997 | Yoon et al. ......................... | 438/778 |
| 5,736,750 | * 4/1998 | Yamazaki et al. ................... | 257/59 |
| 5,763,953 | * 6/1998 | Iljima et al. ........................ | 257/762 |
| 5,880,508 | * 3/1999 | Wu ..................................... | 257/411 |
| 5,907,780 | * 5/1999 | Gilmer et al. ...................... | 438/299 |
| 6,004,850 | * 12/1999 | Lucas et al. ........................ | 438/301 |
| 6,060,406 | * 5/2000 | Alers et al. ......................... | 438/785 |
| 6,060,755 | * 5/2000 | Ma et al. ............................ | 257/410 |
| 6,100,120 | * 8/2000 | Yu ...................................... | 438/151 |
| 6,124,620 | * 9/2000 | Gardner et al. .................... | 257/411 |
| 6,255,204 | * 7/2001 | Tobin et al. ........................ | 438/592 |

FOREIGN PATENT DOCUMENTS

| | | | |
|---|---|---|---|
| 6-204257 | * | 7/1994 | (JP) . |
| 7-183504 | * | 7/1995 | (JP) . |
| 10-178170 | * | 6/1998 | (JP) . |
| 2000-58831 | | 2/2000 | (JP) . |

\* cited by examiner

Primary Examiner—Eddie Lee
Assistant Examiner—José R Diaz
(74) Attorney, Agent, or Firm—Finnegan, Henderson, Farabow, Garrett & Dunner, L.L.P.

(57) ABSTRACT

A semiconductor device includes a Si oxide film formed between a Si substrate and a metallic oxide film is prevented from growing when an annealing treatment is performed after the metallic oxide film is formed, and a method for manufacturing the same.

A semiconductor device comprises a silicon substrate, a gate insulating film formed on the silicon substrate and made of the metallic oxide film, and a gate electrode formed on the gate insulating film, wherein an interface film formed between the gate insulating film and the Si substrate is thinner at the ends of the gate insulating film than in the center thereof.

20 Claims, 29 Drawing Sheets

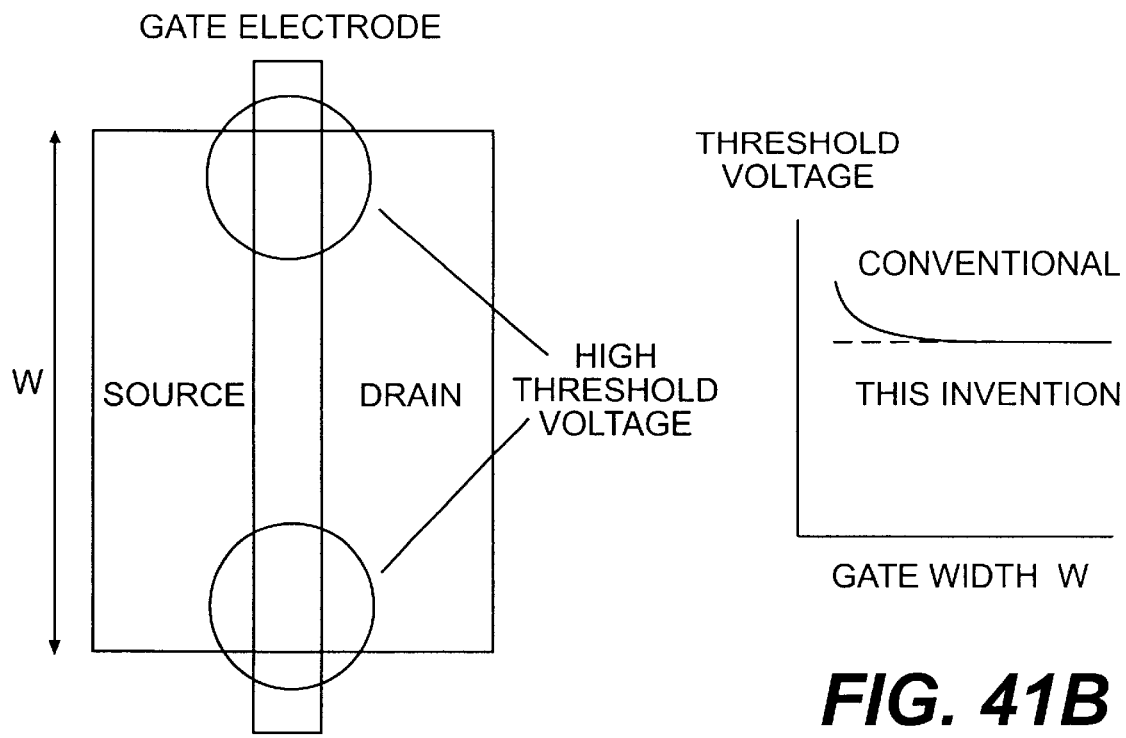
FIG. 41A
FIG. 41B
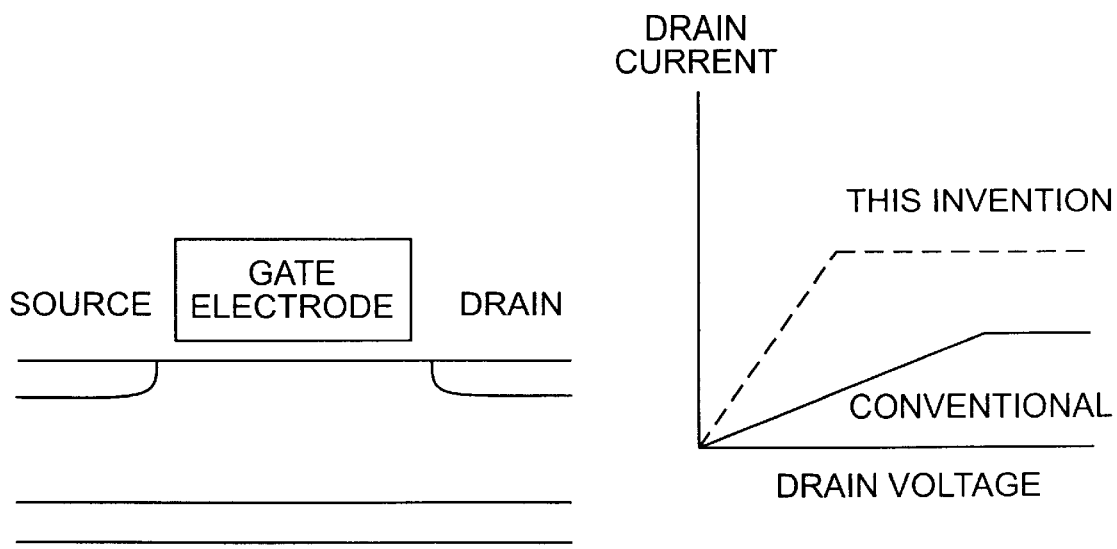
FIG. 42A
FIG. 42B

SEMICONDUCTOR DEVICE AND METHOD FOR MANUFACTURING THE SAME

BACKGROUND OF THE INVENTION

1. Field of the Invention

The present invention relates to a semiconductor device, and in particular, to a structure of a transistor using a metallic oxide film as a gate insulating film and a method for manufacturing the same.

2. Description of the Related Art

Finer processing of a MOS transistor seems to have no bounds, and a gate length of 0.1 μm will become a reality in the near future. This finer processing increases the speed of a device and reduces the power consumption and the area of the device. Also in recent years, this finer processing enables many devices to be mounted on the same chip area and hence can realize a multi-function LSI.

It is thought, however, that the pursuit of the finer processing runs into big barriers at a gate length of 0.1 μm. One of the barriers is the limit of thinning of a gate oxide film. A conventional gate insulating film uses $SiO_2$ because $SiO_2$ can satisfy two characteristics indispensable to the action of the device, that is, the $SiO_2$ includes few fixed electric charges and hardly forms an interface level at the interface between the gate insulating film and the Si of a channel portion. Also, since $SiO_2$ can form a thin film simply with good controllability, it is also effective in the finer processing of the device. However, the relative dielectric constant of the $SiO_2$ is small (3.9) and hence the $SiO_2$ film is made less than 3 nanometers thick so as to satisfy the performance of the transistor in the generation of a gate length of 0.1 μm or less. It is predicted that this thin film thickness presents a problem that carriers directly tunnel through the film and increase the leakage current between the gate and the substrate.

Therefore, research aimed at forming a thick gate insulating film and at preventing a tunneling phenomenon has been conducted by using a material having a larger relative dielectric constant than $SiO_2$. A metallic oxide film made of $Ta_2O_5$ or $TiO_2$ is used as a material having a large relative dielectric constant. It is thought that these are promising materials for preventing the tunneling phenomenon because they have a large relative dielectric constant of about 20 or 90 and hence the thickness thereof can be made about 5 to 20 times as large as the thickness of the $SiO_2$ in order to produce the same gate capacitance.

However, a problem has been pointed out that when a metallic oxide film is formed on a Si substrate by the use of a usual process flow, a Si oxide film having a low dielectric constant is formed with a thickness of about 1 nanometer to 2 nanometers between the metallic oxide film and the Si substrate by a heat treatment in each process. As a heat treatment after the formation of the metallic oxide film, there is an annealing treatment for activating impurities in source/drain regions after the formation of gate side walls (typically, annealing at 800° C. for 60 minutes in a nitrogen atmosphere), an oxidizing process after forming a gate electrode (about 700° C. to 900° C.), a heating process when the gate side wall is deposited (about 600° C. to 800° C.), a heating process for densifying a highly dielectric film (about 600° C. to 1000° C.), and a sintering process (about 300° C. to 500° C.).

The Si oxide film formed by the heat treatment after the formation of the metallic oxide film has a small relative dielectric constant; therefore, it reduces the capacitance of the gate and the substrate and hence reduces the driving force of a MOS transistor. Also, a transistor having a short gate length markedly produces "a short channel effect" of reducing a gate voltage threshold for turning on.

As described above, in a case where a metallic oxide film having a high dielectric constant is used as a gate insulating film, there is a problem that a Si oxide film having a low dielectric constant is formed between the metallic oxide film and a Si substrate by a heat treatment performed after the formation of the metallic oxide film. This reduces the capacitance of the gate and the substrate and hence reduces the driving force of a MOS transistor. Also, a transistor having a short gate length presents a problem that it markedly produces "a short channel effect" of reducing a gate voltage threshold for turning on.

SUMMARY OF THE INVENTION

The present invention has been made to solve the problems described above. It is the object of the present invention to provide a semiconductor device in which a Si oxide film formed between a metallic oxide film and a Si substrate is prevented from growing when the Si substrate is subjected to an annealing treatment after the metallic oxide film is formed and a method for manufacturing the same.

In order to accomplish the object described above, the present invention provides a semiconductor device comprising a silicon substrate; a gate insulating film made of a metallic oxide film and formed over the silicon substrate; and a gate electrode formed over the gate insulating film, wherein an interface film formed between the gate insulating film and the silicon substrate is thinner at the edges of the gate insulating film than at the center thereof.

Also, the present invention provides a semiconductor device comprising a silicon substrate; a gate insulating film made of a metallic oxide film and formed over the silicon substrate; and a gate electrode formed over the gate insulating film, wherein, in a part of the gate insulating film, the ratio of metal to oxygen is larger than a stoichiometric ratio.

Also, the present invention provides a method for manufacturing a semiconductor device that comprises forming a metallic oxide film over a main surface of a silicon substrate surrounded by a device-isolating region; forming a material to be oxidized directly on the metallic oxide film or on the film which is formed on the metallic oxide film and in which an oxidizing agent can diffuse; and performing a heat treatment.

Also, the present invention provides a method for manufacturing a semiconductor device that comprises forming a device-isolating region on the main surface of a silicon substrate; forming a metallic oxide film in which the ratio of metal to oxygen is larger than a stoichiometric ratio and a metallic oxide film in which the ratio of metal to oxygen is nearly equal to a stoichiometric ratio over the main surface of the silicon substrate surrounded by the device-isolating region; and performing a heat treatment.

Also, the present invention provides a method for manufacturing, a semiconductor device that comprises forming a metallic oxide film over a main surface of a silicon substrate surrounded by a device-isolating region; cutting a metal-to-oxygen bond in the metallic oxide film; and performing a heat treatment.

Also, the present invention provides a method for manufacturing a semiconductor device that comprises forming a metallic oxide film over a main surface of a silicon substrate surrounded by a device-isolating region; and performing a heat treatment at 500° C. or more in a reducing gas atmosphere.

Also, the present invention provides a method for manufacturing a semiconductor device, wherein the metallic oxide film is a Ti oxide film.

BRIEF DESCRIPTION OF THE DRAWINGS

FIG. 41 is an illustration showing a top plan view of a MOS transistor and an illustration showing a relationship between a gate width and a threshold voltage.

FIG. 42 is an illustration showing a cross-sectional view of a MOS transistor and an illustration showing a relationship between a drain voltage and a drain current.

DESCRIPTION OF THE PREFERRED EMBODIMENTS

Figure 1:
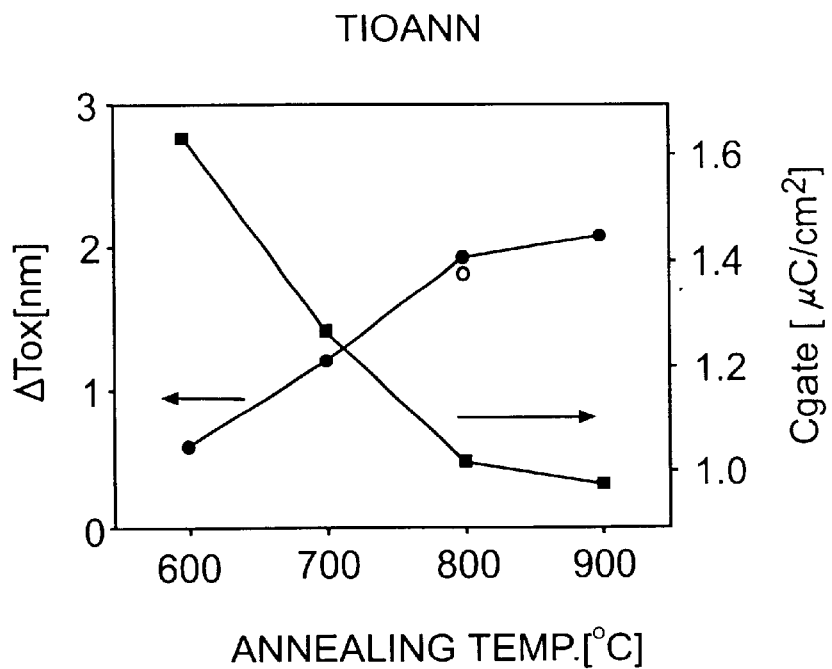
FIG. 1 is an illustration showing a relationship between an annealing temperature and the thickness of a $SiO_2$ film, and a relationship between an annealing temperature and a gate capacitance, wherein the $SiO_2$ film is formed on the interface of a Si substrate and a metallic oxide film by forming on the Si substrate a gate insulating film made of $TiO_2$ as a metallic oxide film having a high dielectric constant and then by annealing the gate insulating film in an Ar atmosphere.

FIG. 1 is an illustration showing a relationship between an annealing temperature and the thickness of a $SiO_2$ film, and a relationship between an annealing temperature and a gate capacitance, wherein the $SiO_2$ film is formed on the interface of a Si substrate and a metallic oxide film by forming on the Si substrate a gate insulating film made of $TiO_2$ as a metallic oxide film having a high dielectric constant and then by annealing the gate insulating film in an Ar atmosphere. As is evident from FIG. 1, as the annealing temperature increases, the $SiO_2$ film becomes thicker and the gate capacitance becomes lower.

Since the surface of the Si substrate is oxidized in the Ar atmosphere in this manner, it is thought that an oxidizing agent in the $TiO_2$ film is diffused in the Si substrate to form the $SiO_2$ film. Also, since the thickness of the $TiO_2$ film and the bonding state thereof are not changed after the $TiO_2$ film is annealed, it is thought that the oxidizing agent is oxygen which is taken in the $TiO_2$ film when the $TiO_2$ film is formed and does not react with Ti.

The present invention has been made on the basis of the findings like this, and it is the object of the present invention to take an extra oxidizing agent in a metallic oxide film such as a $TiO_2$ film in a member tending to be oxidized by putting the member having a tendency to be oxidized into contact with a part of the metallic oxide film and by subjecting it to a heat treatment. This can reduce the thickness of a Si oxide film formed at the interface between the metallic oxide film and the Si substrate and reduce the capacitance between a gate and the Si substrate.

Figure 2:
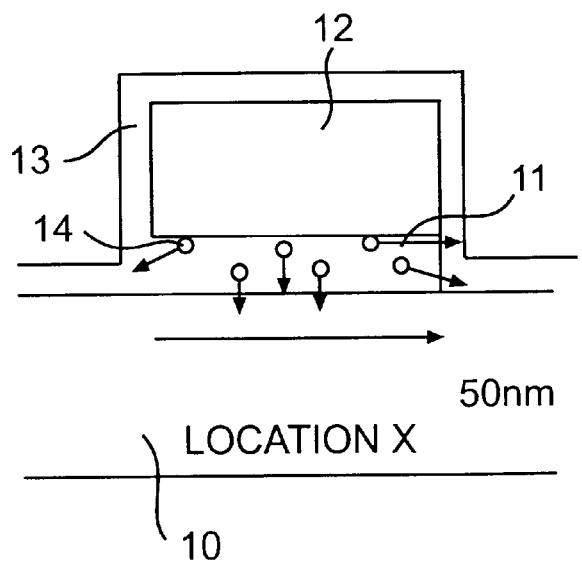
FIG. 2 is a cross-sectional view of a semiconductor device in accordance with the present invention.

FIG. 2 is a cross-sectional view of a semiconductor device in accordance with the present invention.

A gate insulating film 11 made of $TiO_2$ is formed on a Si substrate 10 and a gate electrode 12 is formed thereon. On the side of the gate insulating film 11, a Si film 13 is formed as an agent to be oxidized for absorbing an oxidizing agent from the gate insulating film 11. By subjecting the Si substrate 10 to a heat treatment in this state, an oxidizing agent 14 in the gate insulating film 11 diffuses in the Si film 13 to be oxidized and thus resists diffusing in the Si substrate 10. In this manner, the thickness of a $SiO_2$ film formed on the Si substrate 10 can be reduced.

Figure 3:
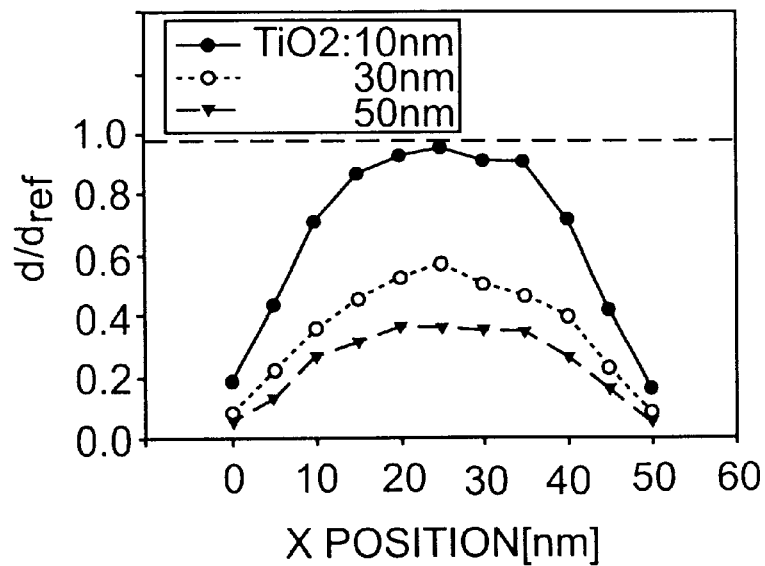
FIG. 3 is an illustration showing the dependence of the thickness of a Si oxide film on a position X in a horizontal direction, wherein the Si oxide film is formed at the interface of a Si substrate and a $TiO_2$ film formed thereon when a Si film is arranged on the side of the $TiO_2$ film and is subjected to a heat treatment until extra oxygen in the $TiO_2$ film is completely consumed.

FIG. 3 is an illustration showing the dependence of the thickness of a Si oxide film on a position X in a horizontal direction in the case of a gate length of 50 nanometers, wherein the Si oxide film is formed at the interface of a Si substrate 10 and a $TiO_2$ film 11 formed thereon when a Si film 13 is arranged on the side of the $TiO_2$ film and is subjected to a heat treatment until extra oxygen 14 in the $TiO_2$ film 11 is completely consumed. Here, a gate electrode 12 is a material which does not reduce $TiO_2$ and is not oxidized. A vertical axis is the thickness of the oxide film formed at the interface which is standardized by the thickness of the oxide film formed when a Si layer 13 is not on the side of the $TiO_2$ film and all the oxidizing agent reacts at the interface.

As shown in FIG. 3, the thickness of the Si oxide film formed at the interface has positional dependence and has a tendency to become thinner at both ends of the gate electrode 12 and thicker toward the center of the gate electrode 12. This shows that oxygen 14 in the $TiO_2$ gate insulating film 11, which is an oxidizing agent, reacts with the Si film 13 formed on the side and is absorbed thereby. The amount of the oxidizing agent 14 diffused in the interface of the Si substrate 10 and the $TiO_2$ gate insulating film 11 is smaller as the thickness of the $TiO_2$ gate insulating film 11 (that is, a ratio of a side area to a total area) is larger. This is shown when the thickness of the $TiO_2$ gate insulating film 11 is 10 nanometers, comparatively thin, the thickness of the Si oxide film at the center is a value which is obtained in a case where all the oxidizing agent reacts at the interface, but that as the thickness of the $TiO_2$ gate insulating film 11 increases from 30 nanometers to 50 nanometers, the thickness of the Si oxide film at the center decreases.

Also, FIG. 3 shows that when oxygen in the $TiO_2$ gate insulating film 11 diffuses isotropically, and when a diffusion coefficient in the horizontal direction with respect to the Si substrate 10 is larger than that in the thickness direction, the thickness of the Si oxide film formed at the interface of the Si substrate 10 and the $TiO_2$ gate insulating film 11 becomes smaller because the oxygen diffuses mainly in the Si film 13 formed on the side. For example, it is reported that the diffusion coefficient of oxygen in $TiO_2$ having a rutile structure is about ten times larger for a c-axis than for an a-axis and a b-axis and hence it is expected that this effect is produced by forming the gate insulating film with the c-axis oriented toward the horizontal direction with respect to the substrate by an ion beam sputtering method.

Figure 4:
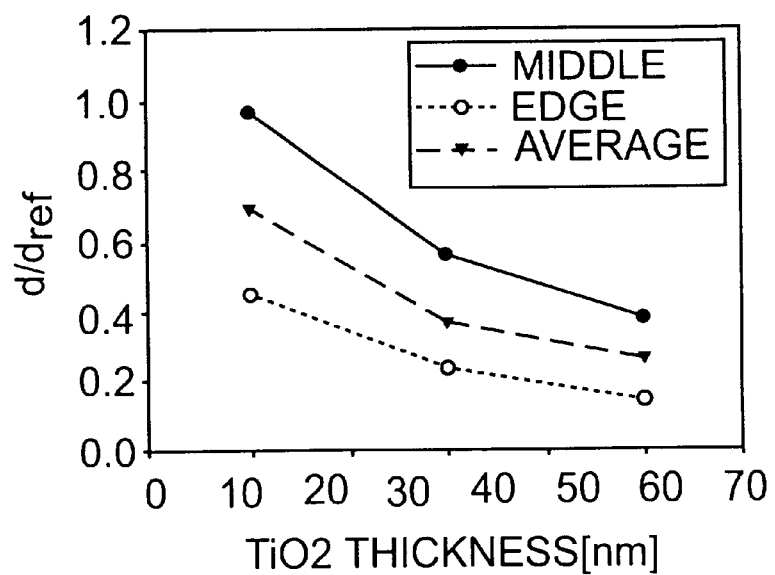
FIG. 4 is an illustration showing the dependence of the thickness of a Si oxide film on position, wherein the Si oxide film exists at the interface between a $TiO_2$ gate insulating film and a Si substrate.

FIG. 4 is an illustration showing the dependence of the thickness of a Si oxide film on position, wherein the Si oxide film exists at the interface between a $TiO_2$ gate insulating film 11 and a Si substrate 10.

As shown in FIG. 4, the oxide film is thin at the ends of the $TiO_2$ gate insulating film 11 and thick at the center. It is the average thickness of the Si oxide film at the interface of the $TiO_2$ gate insulating film 11 and the Si substrate 10 that reflects the gate capacitance of a MOS transistor, and the average thickness determines the driving force of the transistor. In the case in which the thickness of the $TiO_2$ gate insulating film 11 is 10 nanometers, when a Si film 13 is formed on the side and is subjected to a heat treatment, the thickness of the Si oxide film at the interface is about 70%.

Also, it is shown that if the thickness of the gate insulating film 11 becomes thick to 50 nanometers, the thickness of the Si oxide film at the interface becomes thin to about 30% (see Average in FIG. 4).

A semiconductor device in accordance with the present invention and a method for manufacturing the same is described below in detail in conjunction with the drawings.
(Embodiment 1)

A method for manufacturing a semiconductor device of the first preferred embodiment in accordance with the present invention is described below in conjunction with FIGS. 5 to 11, which are cross-sectional views of the semiconductor device.

Figure 5:
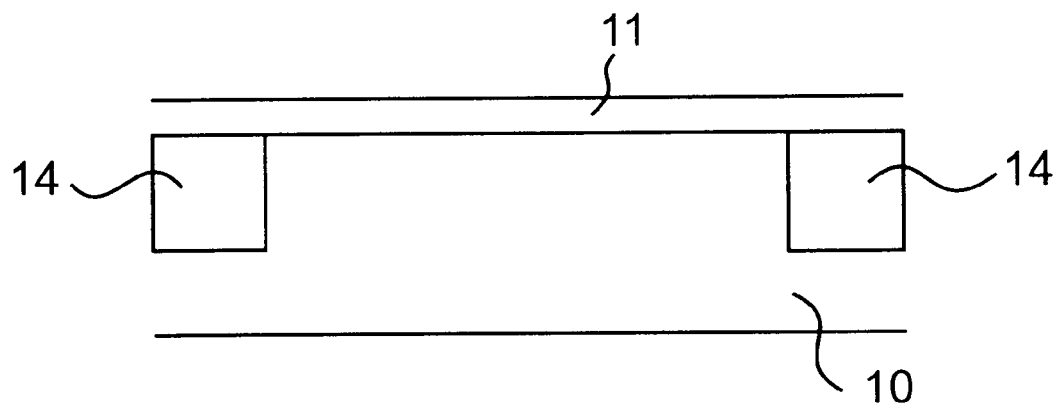
FIGS. 5–11 are cross-sectional views of a semiconductor device showing a method for manufacturing the semiconductor device of the first preferred embodiment in accordance with the present invention.

First, as shown in FIG. 5, a trench having a depth of about 0.4 $\mu$m for an STI (shallow trench isolation) is made on a Si substrate 10 and then $SiO_2$ is deposited on the whole surface of the Si substrate 10 by a chemical vapor deposition (CVD) method. Then the whole surface is planarized by a CMP (chemo-mechanical polishing) method to form a device-isolating region 14.

Next, a mixed gas of TPT (tetra-iso-propyltitanate) (Ti $(OC_3H_7)_4$) and oxygen is flown and is reacted at a growth temperature of 380° C. to deposit a $TiO_2$ film 11 to be a gate insulating film on the whole surface with a thickness of 30 nanometers. At this time, when the $TiO_2$ film 11 is deposited, it is also preferred that a Xe lamp of 200 W be operated so as to apply near-ultraviolet light having a wavelength of 300 nanometers to the whole surface of a wafer through a window of a depositing unit. The Xe lamp is operated before a depositing gas is flown and continues applying the near-ultraviolet light until the deposition is finished. This can prevent the mixing of C and H from an organic source gas and can deposit a film whose composition is completely made of $TiO_2$.

In addition to the mixed gas described above, a mixed gas of oxygen gas and TET (ethyltitanate)(Ti($OC_2H_5$)$_4$) or TTIP (titanium-tetrakis-isopropoxide) may be used as a material gas for a MOCVD (metal oxide chemical vapor deposition). When the TTIP is used, even if it is not mixed with oxygen, a $TiO_2$ film 11 is formed.

Also, instead of the organic source gas, an inorganic source gas such as a $TiCl_4$ gas may be used as the material gas. In this case, however, it is preferable to set a reaction temperature at a slightly higher temperature, for example, about 600° C.

Also, the $TiO_2$ film 11 may be deposited by a sputtering method. Also, a $Ta_2O_5$ film, an $Al_2O_3$ film, a $Y_2O_3$ film, a $ZrO_2$ film, or a (Ba, Sr) $TiO_3$ film may be used as a highly dielectric film.

Figure 6:
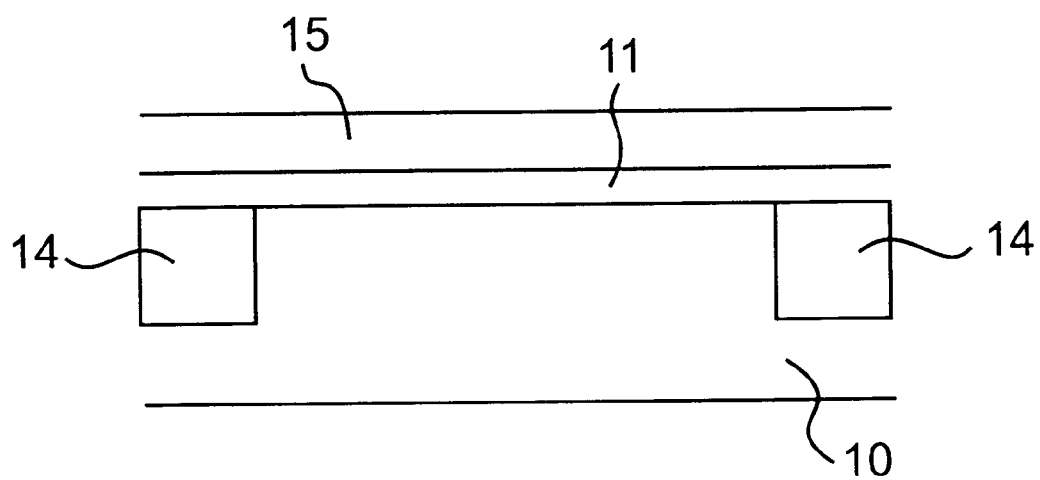

Next, as shown in FIG. 6, a Si film 15 is deposited on the whole surface as a material for absorbing oxygen in the $TiO_2$ film 11 by a CVD method. The Si film 15 may be either polycrystalline or amorphous. Also, it is not necessary to limit a method for depositing the Si film 15 to the CVD method; for example, a sputtering method can be used. Also, Si film 15 may contain the impurities, for example, H, B, As, P, or Ge. The impurities may be one sort or two or more sorts. This is applied to the Si film as an agent to be oxidized for absorbing an oxidizing agent from the gate insulating film in all the cases of the operation described below. Also, it is not necessary to limit a material for absorbing an oxidizing agent to Si, but the material is preferably a material not reducing $TiO_2$ but reacting with oxygen; for example, C, Ta, W, or Mo may be used.

Figure 7:
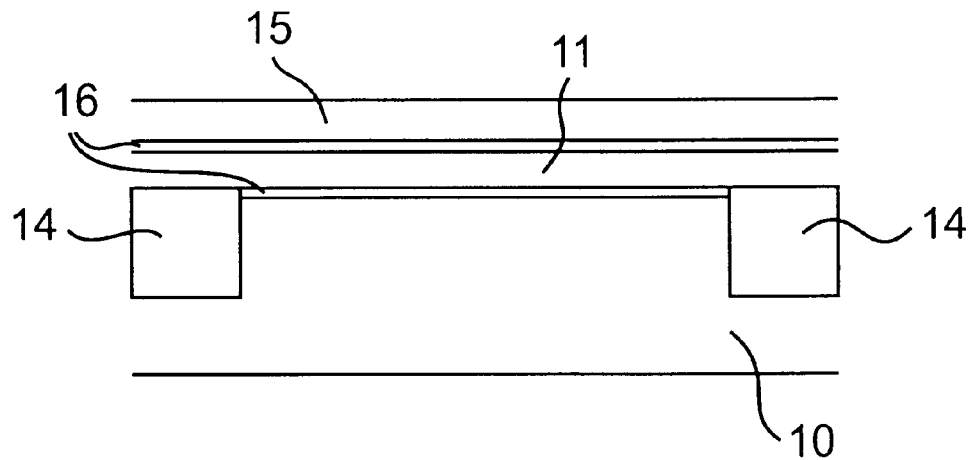

Next, as shown in FIG. 7, an annealing treatment for densifying the $TiO_2$ film 11 is performed (at 800° C. for 30 minutes in an $N_2$ atmosphere). At this time, a $SiO_2$ film 16 is formed at the interface between the $TiO_2$ film 11 and the Si substrate 10 and at the interface between the $TiO_2$ film 11 and the Si film 15 by the diffusion of extra oxygen in the $TiO_2$ film 11.

In the present preferred embodiment, since the annealing for densifying diffuses oxygen not only in the Si substrate 10 but also in the upper Si film 15, the $SiO_2$ film 16 formed at the interface of the Si substrate 10 is thinned, compared with a case where the Si film 15 is not formed.

Although a heat treatment is used also in the following processes, it is possible to prevent an increase in thickness of the $SiO_2$ film 16 formed at the interface between the Si substrate 10 and the $TiO_2$ film 11 by consuming all the extra oxygen in the $TiO_2$ film 11 as the Si oxide film 16.

Figure 8:
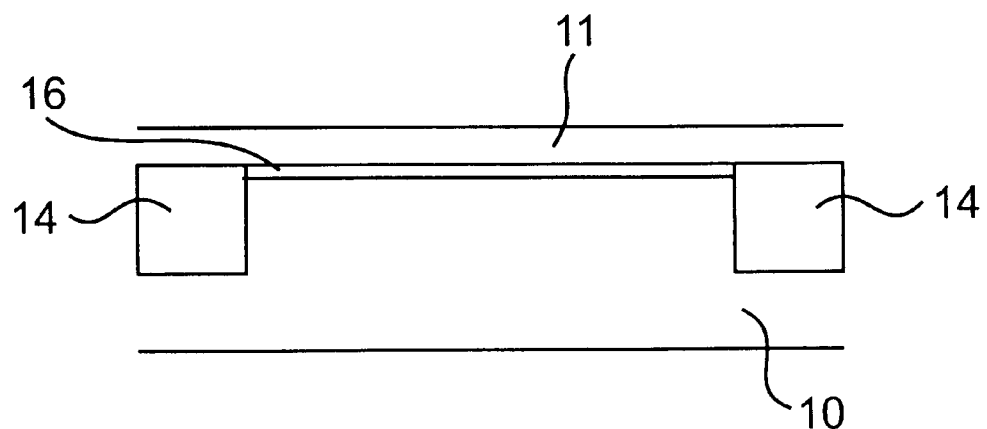

Next, as shown in FIG. 8, a not-yet-reacted Si layer 15 and the $SiO_2$ film 16 right under the Si layer 15 are removed by plasma using a $CF_4$ gas.

Figure 9:
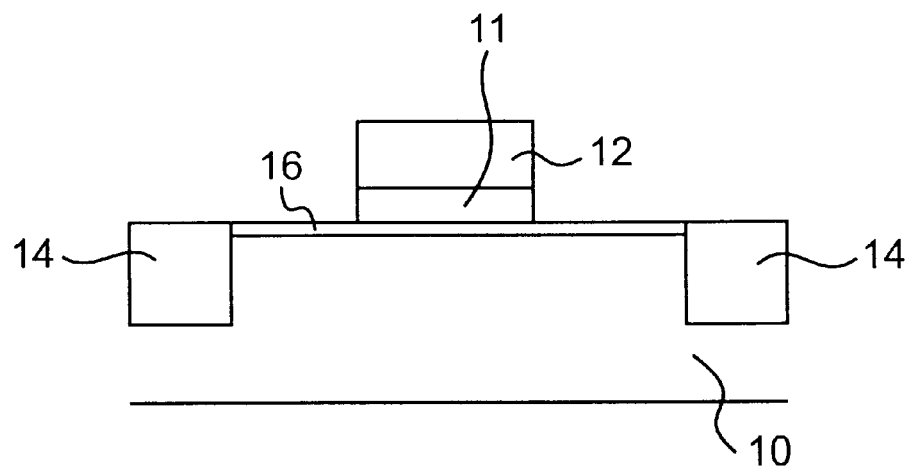

Next, as shown in FIG. 9, a Pt film is deposited by a sputtering method and a gate electrode position is defined by the use of a lithography technique. Then, the Pt film and $TiO_2$ film are etched away to the $SiO_2$ film 16 by a reactive ion etching by the use of a chlorine-based etching gas (for example, a $BCl_3$ gas, or a mixed gas of a $BCl_3$ gas and a HBr gas) to form a gate electrode 12 and a $TiO_2$ gate insulating film 11. It is not necessary to limit the material of the gate electrode 12 to Pt, but it is preferable that the material does not reduce a highly dielectric body and resists reacting with oxygen. For example, a single metal such as Au, a metallic silicide such as $TiSi_2$, $MoSi_2$, $WSi_2$, or a compound alloy such as TiN may be used.

Figure 10:
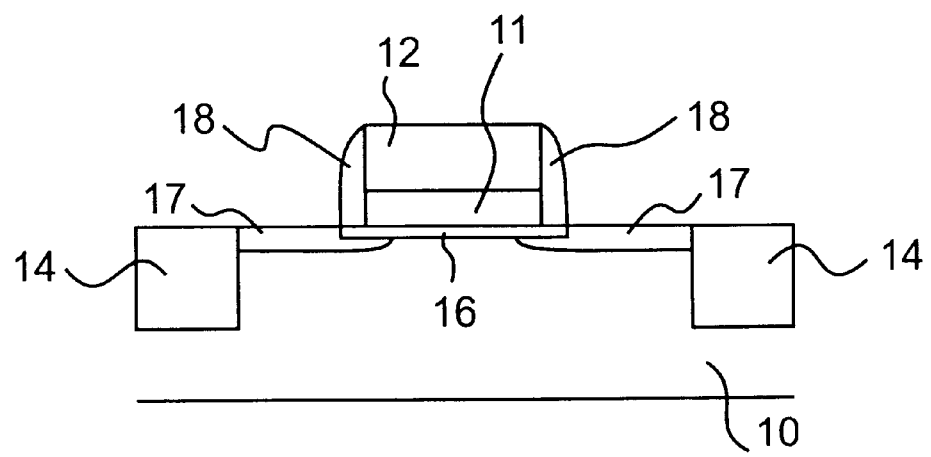

Next, as shown in FIG. 10, side walls 18 are formed on the sides of the gate electrode 12 and the gate insulating film 11 and source/drain regions 17 are formed by an ion implantation method.

Figure 11:
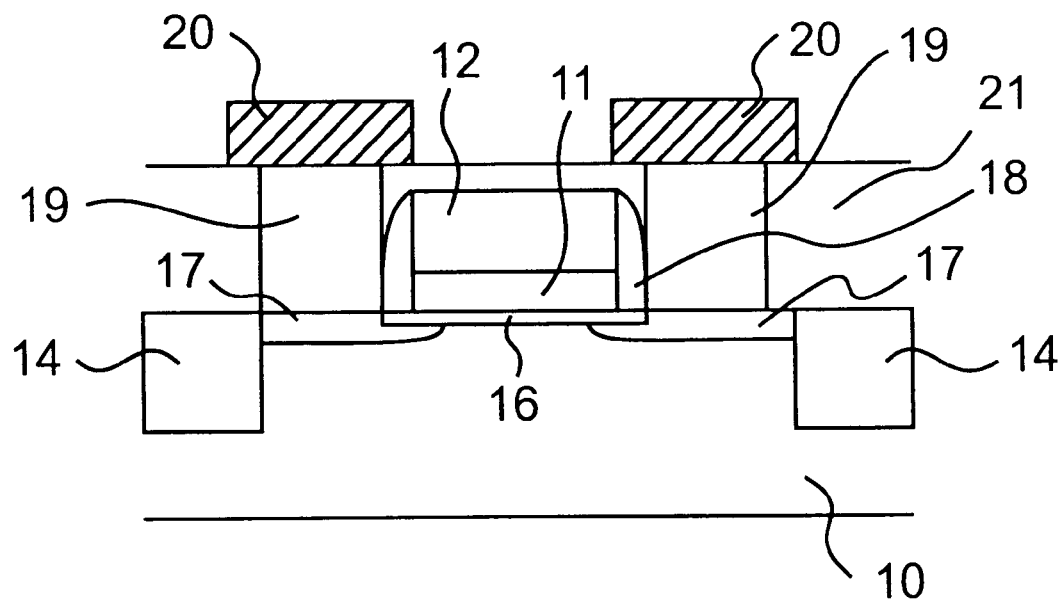

Next, as shown in FIG. 11, an interlayer insulating film 21 is formed with an insulating film made of $SiO_2$ or the like and then contact holes are made in the source/drain regions 17. Then, contacts 19 are formed and source/drain electrodes 20 are formed. In this manner, a field effect transistor in accordance with the present invention is formed.

In the field effect transistor formed in the present preferred embodiment, it is possible to extremely thin the Si oxide film right under the gate insulating film made of the highly dielectric film, and the driving force of the transistor may be significantly improved.

In the present preferred embodiment, the $TiO_2$ film 11 which is to be the gate insulating film is formed directly on the Si substrate 10, but it may be deposited thereon via an insulating film such as a $SiO_2$ film, a $SiN_x$ film, or the like.

(Embodiment 2)

Next, a method for manufacturing a semiconductor device of the second preferred embodiment in accordance with the present invention is described below in conjunction with FIGS. 12 to 14, which are cross-sectional views of the semiconductor device.

Figure 12:
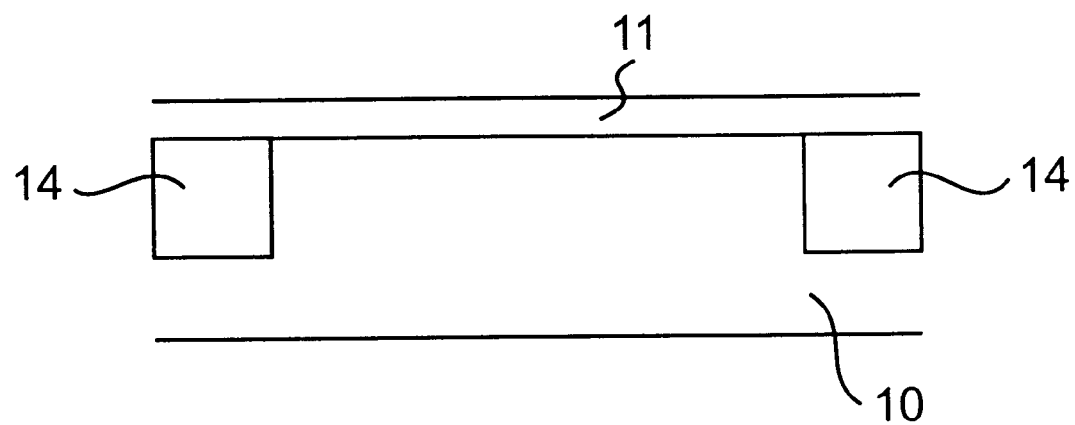
FIGS. 12–14 are cross-sectional views of a semiconductor device showing a method for manufacturing the semiconductor device of the second preferred embodiment in accordance with the present invention.

First, as shown in FIG. 12, a trench having a depth of about 0.4 $\mu$m for an STI (shallow trench isolation) is made on a Si substrate 10. A $SiO_2$ film is deposited on the whole surface of the Si substrate 10 by a CVD method and then the whole surface is planarized by a CMP (chemo-mechanical polishing) method to form a device-isolating region 14.

Next, a mixed gas of TPT (tetra-iso-propyltitanate) (Ti $(OC_3H_7)_4$) and oxygen is flown and is reacted at a substrate temperature of 380° C. to deposit a $TiO_2$ film 11 on the whole surface with a thickness of 30 nanometers.

Figure 13:
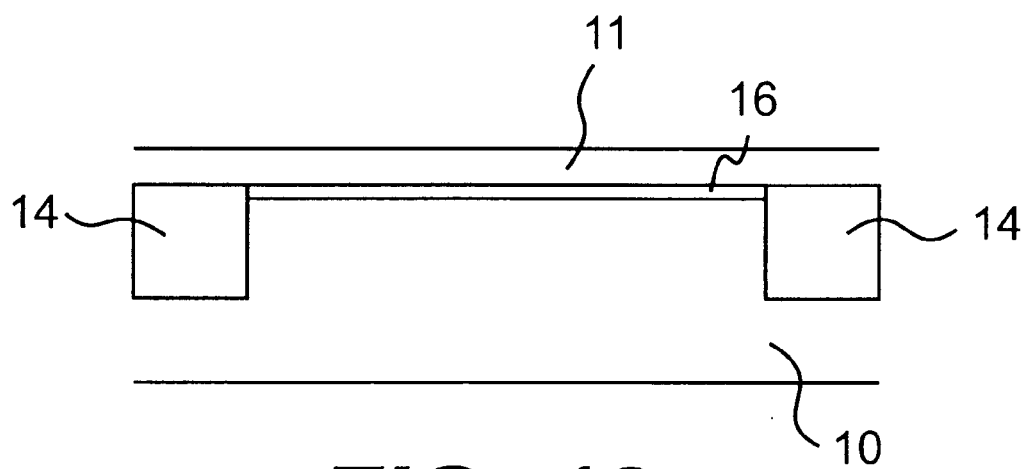

Next, as shown in FIG. 13, the whole surface is subjected to an annealing treatment for densifying the $TiO_2$ film 11 (at 800° C. for 30 minutes in a $N_2$ atmosphere) in a gas which reduces extra oxidizing agent in the $TiO_2$ film 11, for example, in a gas containing CO. At this time, the thickness of a $SiO_2$ film 16 formed at the interface between the $TiO_2$ film 11 and the Si substrate 10 is reduced because oxygen reacts with CO on the surface of the $TiO_2$ film 11 and not-yet-reacted oxygen in the film is reduced. A heat treatment temperature is not less than 500° C.

Figure 14:
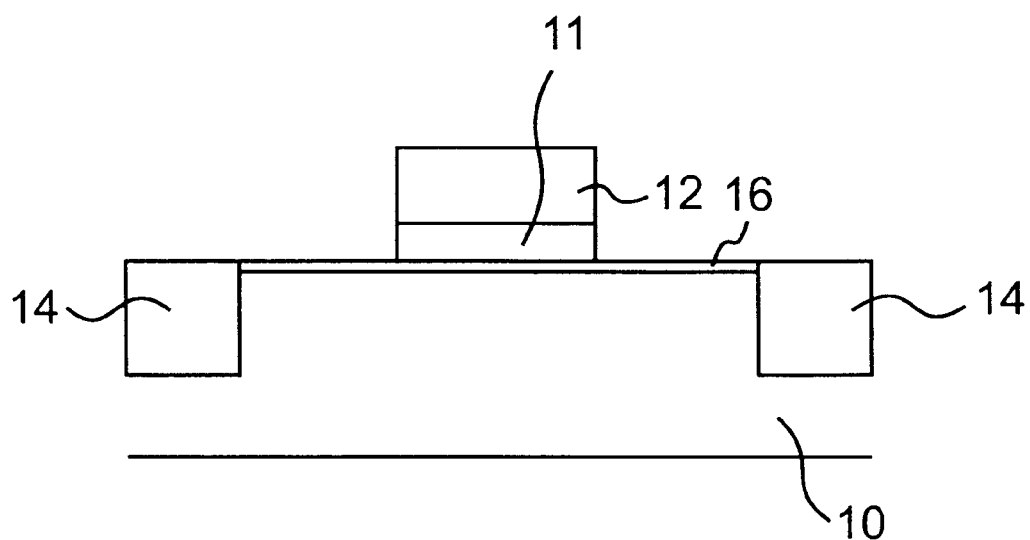

Next, as shown in FIG. 14, a Pt film to be a gate electrode 12 is deposited by a sputtering method and a gate electrode position is defined by the use of a lithography technique. Then, the Pt film and $TiO_2$ film are etched away to the $SiO_2$ film 16 by a reactive ion etching by the use of a chlorine-based etching gas (for example, a $BCl_3$ gas, or a mixed gas of a $BCl_3$ gas and an HBr gas).

The following processes are performed in the same way as is used in the preferred embodiment 1 to form a field effect transistor. Also in the field effect transistor formed in the present preferred embodiment, it is possible to thin a $SiO_2$ film 16 directly under the highly dielectric gate insulating film 11 and to significantly improve the driving force of the transistor.

In the present preferred embodiment, the atmosphere of the annealing treatment for densifying the $TiO_2$ film 11 to be the gate insulating film having a high dielectric constant is not necessarily limited to the atmosphere containing CO, but it is preferred that an atmosphere contain one or more kinds of reducing gases such as a $CF_x$ gas, a $CH_x$ gas, an NO gas, an $H_2$ gas, or the like.

(Embodiment 3)

Next, a method for manufacturing a semiconductor device of the third preferred embodiment in accordance with the present invention is described below in conjunction with FIGS. 15 to 18, which are cross-sectional views of the semiconductor device.

Figure 15:
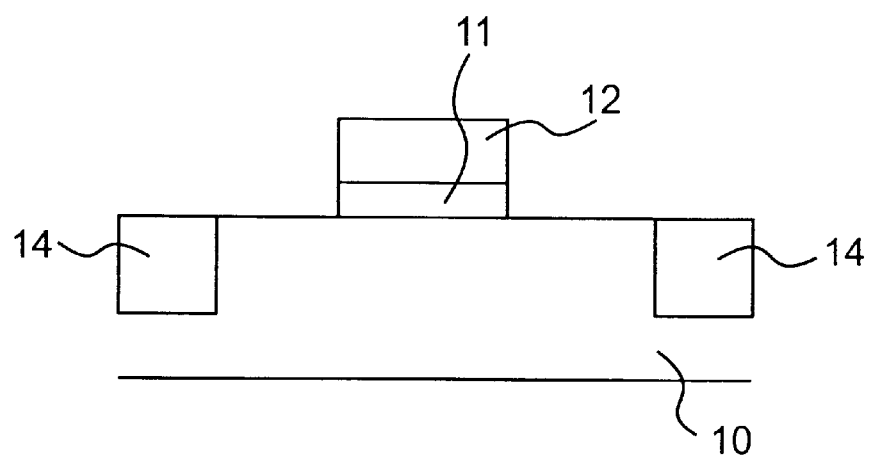
FIGS. 15–18 are cross-sectional views of a semiconductor device showing a method for manufacturing the semiconductor device of the third preferred embodiment in accordance with the present invention.

First, as shown in FIG. 15, a trench having a depth of about 0.4 $\mu$m for an STI (shallow trench isolation) is made on a Si substrate 10 and then a $SiO_2$ film is deposited on the whole surface of the Si substrate 10 by a CVD method and then the whole surface is planarized by a CMP (chemo-mechanical polishing) method to form a device-isolating region 14.

Next, a mixed gas of TPT (tetra-iso-propyltitanate) (Ti $(OC_3H_7)_4$) and oxygen is flown and is reacted at a substrate temperature of 380° C. to deposit a $TiO_2$ film 11 to be a gate insulating film 11 on the whole surface with a thickness of 30 nanometers. The $TiO_2$ film 11 is deposited with a cold-water-type MOCVD apparatus and the TPT gas is carried by a bubbling Ar gas. A carrier gas line is continuously heated over 50° C. so as to prevent the TPT from attaching again to the gas line. The Ar gas containing the TPT is introduced by 5 sccm (Standard Cubic Centimeter per minute) and oxygen is introduced so as to make the total pressure 1 Torr.

Next, a Pt film to be a gate electrode 12 is deposited on the whole surface by a sputtering method. Next, a gate electrode position is defined by the use of a lithography technique, and then the Pt film and $TiO_2$ film are etched away to the Si substrate 10 by a reactive ion etching by the use of a chlorine-based etching gas (for example, a $BCl_3$ gas, or a mixed gas of a $BCl_3$ gas and an HBr gas).

Figure 16:
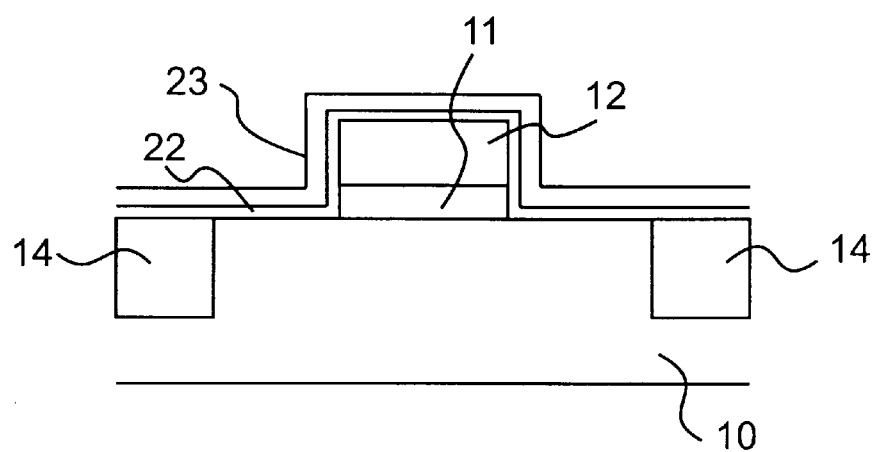

Next, as shown in FIG. 16, a $SiO_2$ film 22 is deposited on the whole surface with a thickness of 5 nanometers at a substrate temperature of 400° C. by a CVD method and a Si film 23 is deposited in sequence with a thickness 10 nanometers at a substrate temperature of 600° C. Since a thermal history is considerably little at this time, the diffusion of oxygen from the TiO$_2$ film 11 is reduced and hence an oxide film hardly grows at the interface of the Si substrate and the TiO$_2$ film 11.

Figure 17:
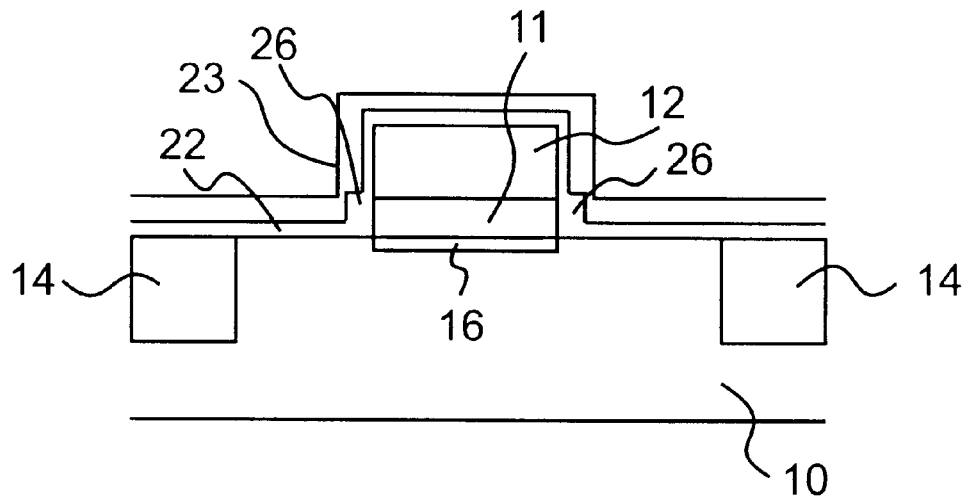

Next, as shown in FIG. 17, an annealing treatment for densifying the TiO$_2$ film 11 is performed (at 800° C. for 30 minutes in an N$_2$ atmosphere). At this time, a SiO$_2$ film 16 is formed between the TiO$_2$ film 11 and the Si substrate 10, and extra oxygen diffuses in the Si film 23 via the SiO$_2$ film 22 from the side of the TiO$_2$ film 11 to increase the thickness of a SiO$_2$ film 26. Therefore, as compared with the case where a member having a tendency to be oxidized is not formed on the side of the TiO$_2$ film 11, the thickness of the SiO$_2$ film 16 formed on the surface of the Si substrate 10 is reduced. Since the SiO$_2$ film 22 is formed in a very thin thickness of 5 nanometers, the extra oxidizing agent in the TiO$_2$ film 11 easily passes through the SiO$_2$ film 22 and diffuses in the Si film 23.

Figure 18:
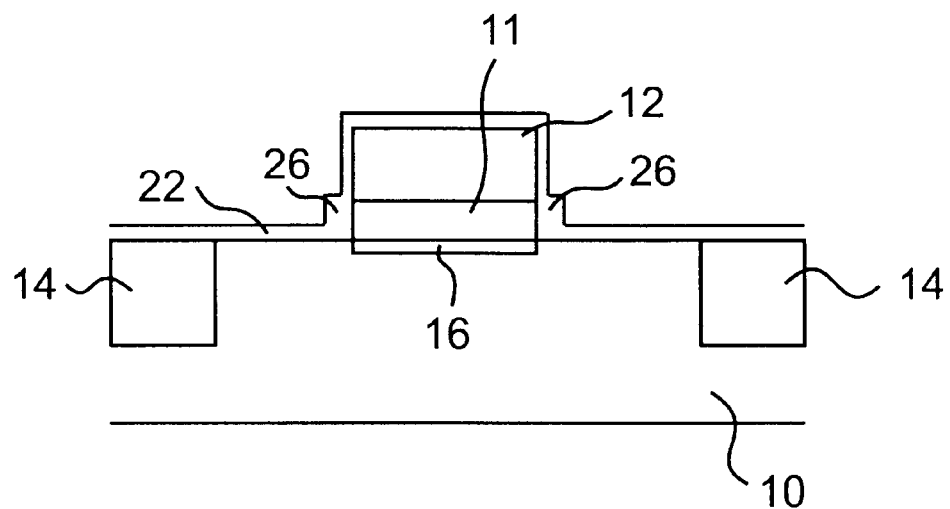

Next, as shown in FIG. 18, only not-yet-reacted Si layer 23 is etched away by the use of plasma using a CF$_4$ gas. The SiO$_2$ film 22 functions as an etching stopper when the not-yet-reacting Si layer 23 is etched away. The following processes are performed in the same way as is used in the preferred embodiment 1 to form a field effect transistor.

Also in a transistor of the present preferred embodiment, it is possible to thin a SiO$_2$ film right under a gate insulating film having a high dielectric constant and to significantly improve the driving force of the transistor.

(Embodiment 4)

Next, a method for manufacturing a semiconductor device of the fourth preferred embodiment in accordance with the present invention is described below in conjunction with FIGS. 19 to 21, which are cross-sectional views of the semiconductor device.

Figure 19:
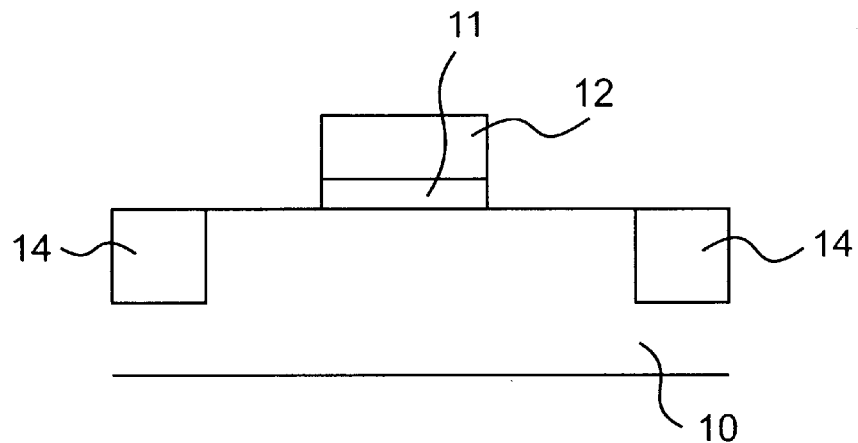
FIGS. 19–21 are cross-sectional views of a semiconductor device showing a method for manufacturing the semiconductor device of the fourth preferred embodiment in accordance with the present invention.

First, as shown in FIG. 19, a trench having a depth of about 0.4 μm for an STI (shallow trench isolation) is made on a Si substrate 10, and then a SiO$_2$ film is deposited on the whole surface of the Si substrate 10 by a CVD method. Then the whole surface is planarized by a CMP (chemo-mechanical polishing) method to form a device-isolating region 14.

Next, a mixed gas of TPT (tetra-iso-propyltitanate) (Ti (OC$_3$H$_7$)$_4$) and oxygen is flown and is reacted at a substrate temperature of 380° C. to deposit a TiO$_2$ film to be a gate insulating film 11 on the whole surface with a thickness of 30 nanometers.

Next, a Pt film to be a gate electrode 12 is deposited on the whole surface by a sputtering method. Next, a gate electrode position is defined by the use of a lithography technique, and then the Pt film and TiO$_2$ film are etched away to the Si substrate 10 by a reactive ion etching by a chlorine-based etching gas (for example, a BCl$_3$ gas, or a mixed gas of a BCl$_3$ gas and an HBr gas).

Figure 20:
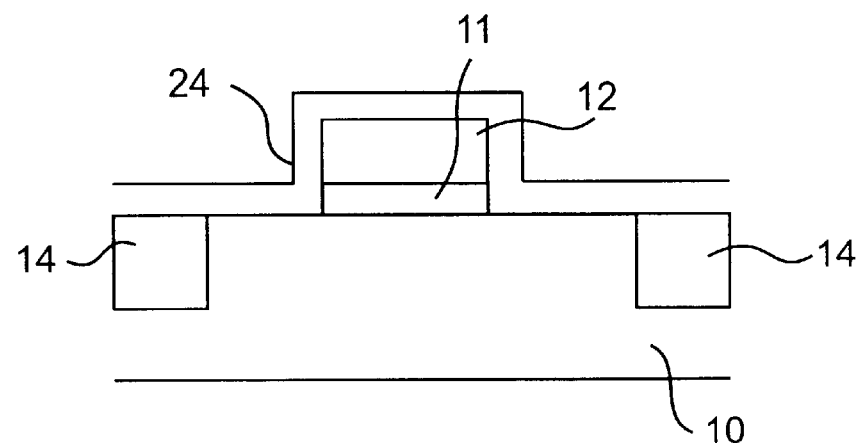

Next, as shown in FIG. 20, a Si film 24 is deposited with a thickness of 5 nanometers at a growth temperature of 600° C. by a CVD method. Since a thermal history is considerably little at this time, the diffusion of oxygen from the TiO$_2$ film 11 is prevented and hence very little, if any, growth of an oxide film occurs at the interface of the Si substrate 10 and the TiO$_2$ film 11.

Figure 21:
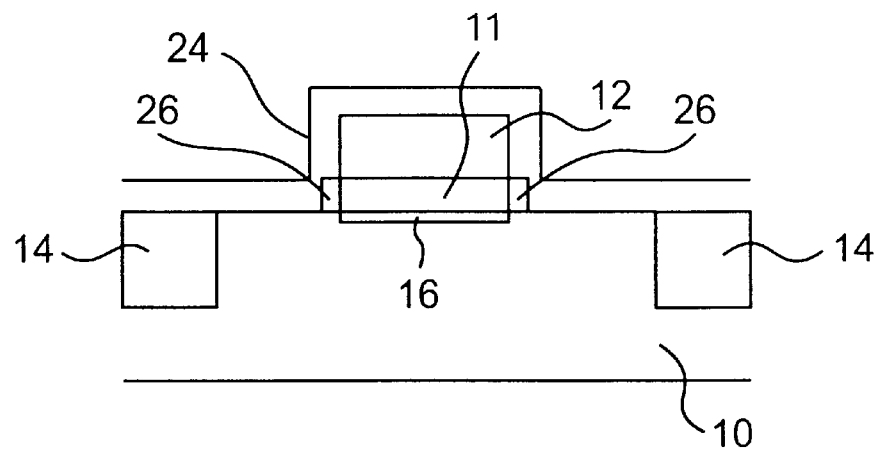

Next, as shown in FIG. 21, an annealing treatment is performed for densifying the TiO$_2$ film 11 and post-oxidizing it after processing a gate (at 800° C. for 30 minutes in an N$_2$ atmosphere). At this time, an extra oxidizing agent in the TiO$_2$ film 11 diffuses not only in the interface of the Si substrate 10 and the TiO$_2$ film 11 but also in a Si film 24 formed on the side of the TiO$_2$ film 11, and hence the thickness of a SiO$_2$ film 16 at the interface can be reduced.

A reference numeral 26 designates a SiO$_2$ film formed on the side of the TiO$_2$ film 11. Then, the Si film 25 is etched away and then a field effect transistor is formed in the same processes as are used in the preferred embodiment 1.

Also in a transistor of the present preferred embodiment, it is possible to thin the SiO$_2$ film right under the gate insulating film having a high dielectric constant and to improve the driving force of the transistor.

(Embodiment 5)

Next, a method for manufacturing a semiconductor device of the fifth preferred embodiment in accordance with the present invention is described below in conjunction with FIGS. 22 to 25, which are cross-sectional views of the semiconductor device.

Figure 22:
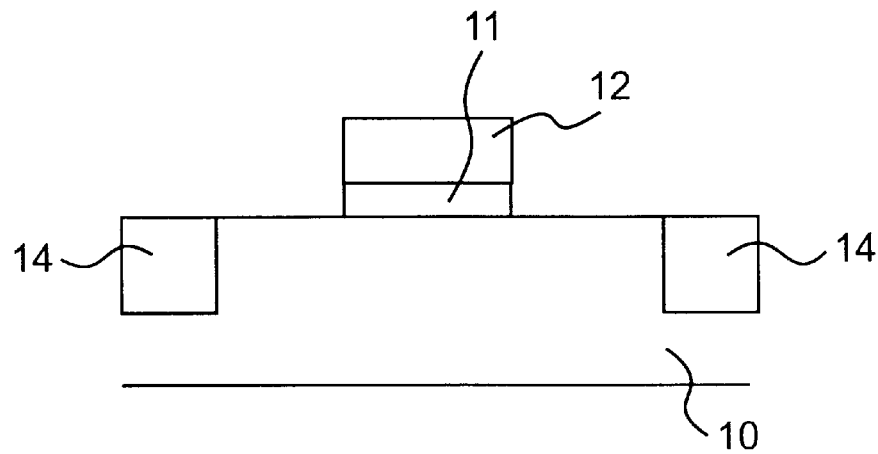
FIGS. 22–25 are cross-sectional views of a semiconductor device showing a method for manufacturing the semiconductor device of the fifth preferred embodiment in accordance with the present invention.

First, as shown in FIG. 22, a trench having a depth of about 0.4 μm for an STI (shallow trench isolation) is made on a Si substrate 10 and then a SiO$_2$ film is deposited on the whole surface of the Si substrate 10 by a CVD method. Then the whole surface is planarized by a CMP (chemo-mechanical polishing) method to form a device-isolating region 14.

Next, a mixed gas of TPT (tetra-iso-propyltitanate) (Ti (OC$_3$H$_7$)$_4$) and oxygen is flown and is reacted at a substrate temperature of 380° C. to deposit a TiO$_2$ film to be a gate insulating film 11 on the whole surface with a thickness of 30 nanometers. Then, a Pt film to be a gate electrode 12 is deposited on the whole surface by a sputtering method.

Next, a gate electrode position is defined by the use of a lithography technique, and then the Pt film and TiO$_2$ film are etched away to the Si substrate 10 by a reactive ion etching by the use of a chlorine-based etching gas (for example, a BCl$_3$ gas, or a mixed gas of a BCl$_3$ gas and an HBr gas).

Figure 23:
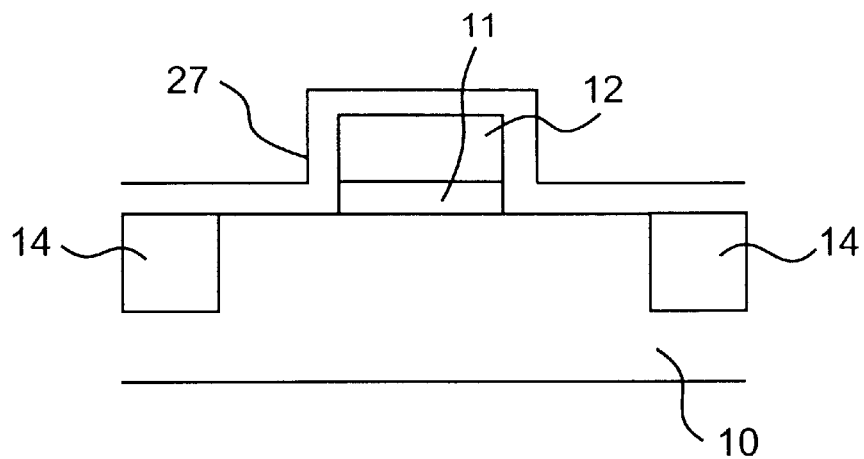

Next, as shown in FIG. 23, a material to be a gate side wall, for example, a SiN film 27 is deposited. The SiN film 27 is also a material capable of absorbing an extra oxidizing agent in the TiO$_2$ film 11.

Figure 24:
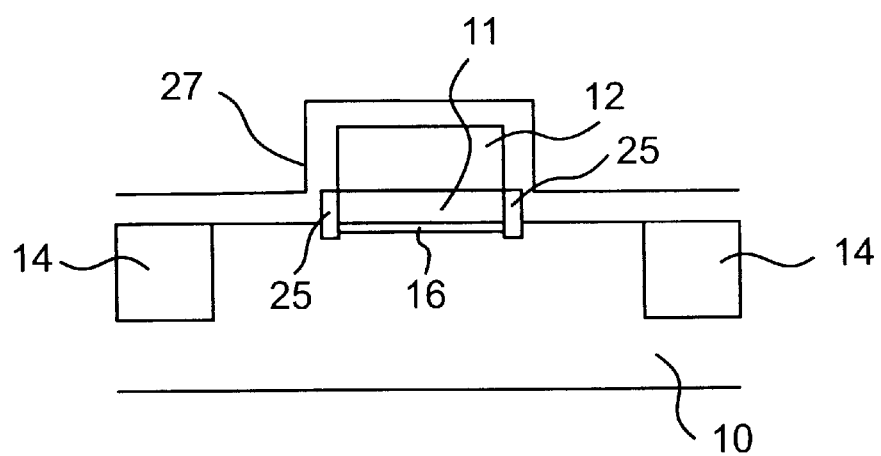

Next, as shown In FIG. 24, an annealing treatment is performed, for example, at 800° C. for 30 minutes in an oxygen atmosphere to densify the TiO$_2$ film 11. At this time, the SiN film 27 formed on the side of the TiO$_2$ film 11 reacts with an extra oxidizing agent in the TiO$_2$ film 11 to form a SiON film 25. This can reduce the thickness of a SiO$_2$ film 16 formed at the interface between the TiO$_2$ film 11 and the Si substrate 10. The annealing treatment is not necessarily performed in the oxygen atmosphere; for example, it may be performed in a nitrogen atmosphere or an argon atmosphere.

Figure 25:
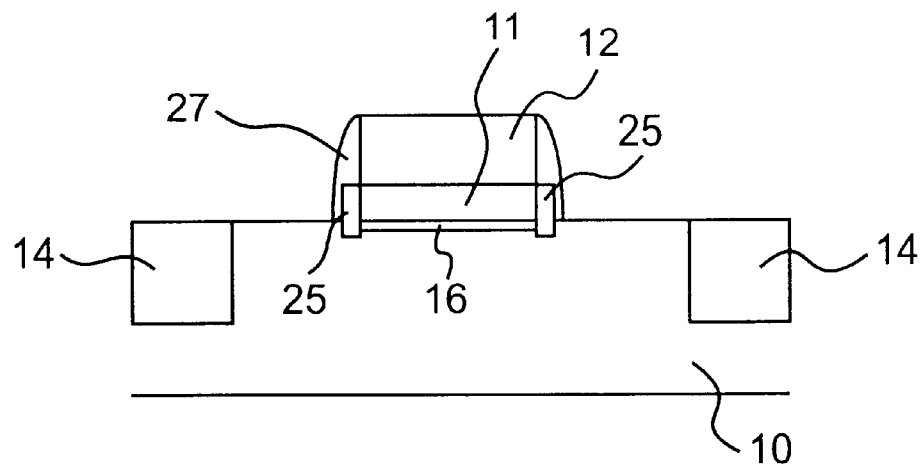

Next, as shown in FIG. 25, all the side walls are subjected to an RIE (reactive ion etching) to preserve the side walls. The following processes are performed in the same way as are used in the preferred embodiment 1 to form a field effect transistor.

Also in a transistor of the preferred embodiment, it is possible to thin the SiO$_2$ film right under the gate insulating film having a high dielectric constant and to improve the driving force of the transistor.

In the preferred embodiment, a material for the side wall is not limited to SiN but a material to be oxidized, such as Si, may be used. In this case, however, an annealing treatment after the deposition of the material for the side wall is performed in an oxidizing atmosphere to transform the Si material to a Si oxide film completely. Also, this annealing treatment is not necessarily performed just after the side wall is formed, but it may be performed at the same time when an annealing treatment for activation is performed after impurities are introduced into source/drain regions. As described above, in the preferred embodiment, the extra oxidizing agent in the film having a high dielectric constant is absorbed, and at the same time, the gate side walls can be formed.

(Embodiment 6)

Next, a method for manufacturing a semiconductor device of the sixth preferred embodiment in accordance with the present invention is described below in conjunction with FIGS. 26 and 27, which are cross-sectional views of the semiconductor device.

Figure 26:
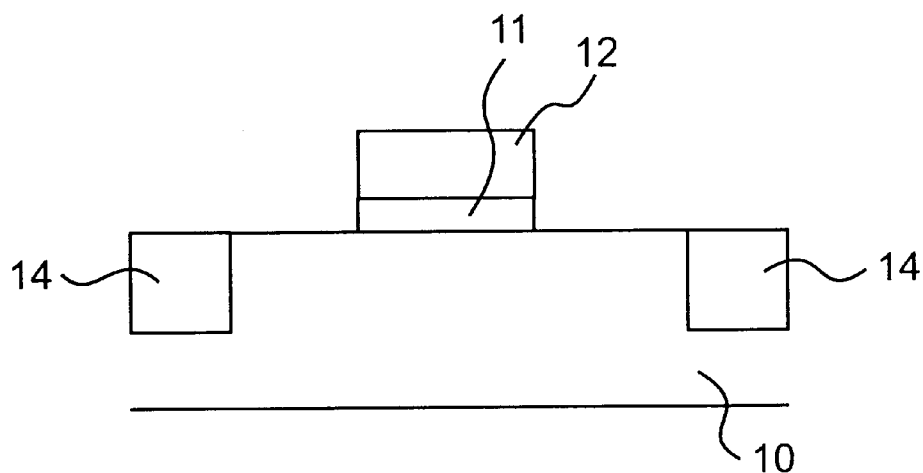
FIGS. 26–27 are cross-sectional views of a semiconductor device showing a method for manufacturing the semiconductor device of the sixth preferred embodiment in accordance with the present invention.

First, as shown in FIG. 26, a trench having a depth of about 0.4 μm for an STI (shallow trench isolation) is made on a Si substrate 10 and then a $SiO_2$ film is deposited on the whole surface of the Si substrate 10 by a CVD method. Then the whole surface is planarized by a CMP (chemo-mechanical polishing) method to form a device-isolating region 14.

Next, a mixed gas of TPT (tetra-iso-propyltitanate) (Ti $(OC_3H_7)_4$) and oxygen is flown and is reacted at a substrate temperature of 380° C. to deposit a $TiO_2$ film to be a gate insulating film 11 on the whole surface with a thickness of 30 nanometers. Then, a Pt film to be a gate electrode 12 is deposited on the whole surface by a sputtering method.

Next, a gate electrode position is defined by the use of a lithography technique, and then the Pt film and $TiO_2$ film are etched away to the Si substrate 10 by a reactive ion etching using a chlorine-based etching gas (for example, a $BCl_3$ gas, or a mixed gas of a $BCl_3$ gas and an HBr gas).

Figure 27:
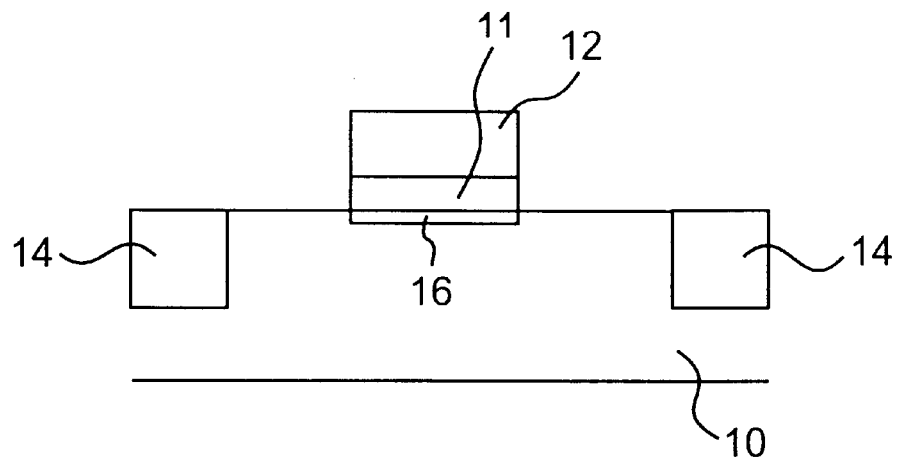

Next, as shown in FIG. 27, the whole surface is subjected to an annealing treatment (at 800° C. for 30 minutes in an $N_2$ atmosphere)in a reducing gas containing CO to densify the $TiO_2$ film 11. At this time, not-yet-reacted oxygen in the $TiO_2$ film 11 reacts with CO on the side of the $TiO_2$ film to reduce the not-yet-reacted oxygen in the $TiO_2$ film 11. This can thin the thickness of a $SiO_2$ film 16 formed at the interface between the Si substrate 10 and the $TiO_2$ film 11. At this time, it is preferable that the not-yet-reacted oxygen in the $TiO_2$ film 11 is sufficiently reduced in this process so as not to increase the thickness of the $SiO_2$ film 16 in the following processes. The following processes are performed in the same way as is used in the preferred embodiment 1 to form a field effect transistor.

Also in the transistor formed in this manner, it is possible to thin the $SiO_2$ film right under the gate insulating film having a high dielectric constant and improve the driving force of the transistor.

Also, the atmosphere of the annealing treatment for densifying the $TiO_2$ film 11 is not necessarily limited to the atmosphere containing CO, but it is preferred that the atmosphere contain one or more kinds of reducing gases such as a $CF_x$ gas, a $CH_x$ gas, an NO gas, an $H_2$ gas, or the like.

(Embodiment 7)

Next, a method for manufacturing a semiconductor device of the seventh preferred embodiment in accordance with the present invention is described below in conjunction with FIGS. 28 to 31, which are cross-sectional views of the semiconductor device.

Figure 28:
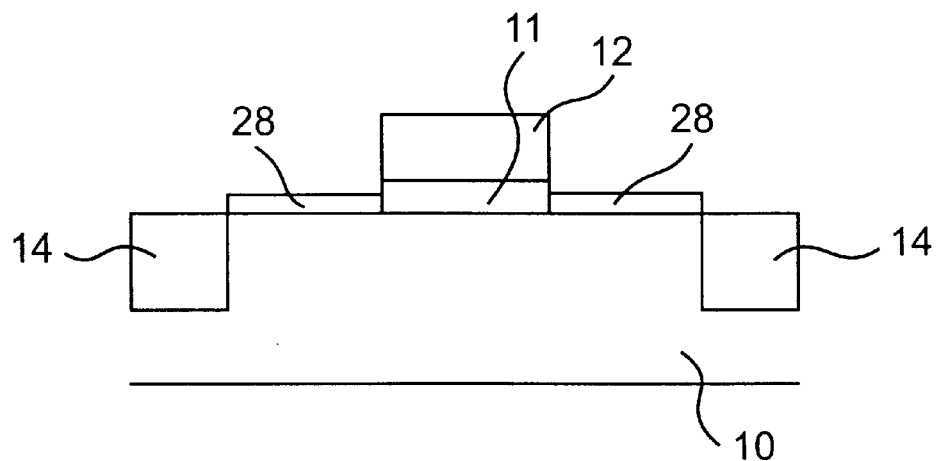
FIGS. 28–31 are cross-sectional views of a semiconductor device showing a method for manufacturing the semiconductor device of the seventh preferred embodiment in accordance with the present invention.

First, as shown in FIG. 28, a trench having a depth of about 0.4 μm for an STI (shallow trench isolation) is made on a Si substrate 10 and then a $SiO_2$ film is deposited on the whole surface of the Si substrate 10 by a CVD method. Then the whole surface is planarized by a CMP (chemo-mechanical polishing) method to form a device-isolating region 14.

Next, a mixed gas of TPT (tetra-iso-propyltitanate) (Ti $(OC_3H_7)_4$) and oxygen is flown and is reacted at a substrate temperature of 380° C. to deposit a $TiO_2$ film 11 to be a gate insulating film 11 on the whole surface with a thickness of 30 nanometers. Then, a Pt film to be a gate electrode 12 is deposited on the whole surface by a sputtering method.

Next, a gate electrode position is defined by the use of a lithography technique, and then the Pt film and $TiO_2$ film are etched away to the Si substrate 10 by a reactive ion etching by the use of a chlorine-based etching gas (for example, a $BCl_3$ gas, or a mixed gas of a $BCl_3$ gas and an HBr gas).

Next, a Si film 28 is deposited only on source/drain regions a thickness of 100 nanometers using a non-doped Si-selective deposition technology. The Si film 28 may contain the impurities, for example, As, P, or B. Then, impurities such as As or $BF_2$ are ion-implanted into the source/drain regions.

Figure 29:
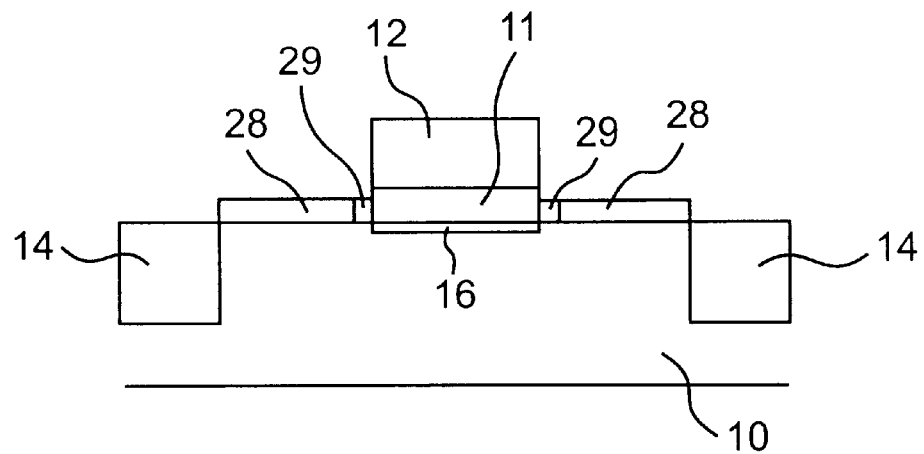

Next, as shown in FIG. 29, the whole surface is subjected to a heat treatment (for example, at 800° C. for 30 minutes in an $N_2$ atmosphere) to densify the $TiO_2$ film 11. This heat treatment grows a $SiO_2$ film 29 between the Si film 28 and the $TiO_2$ film 11 and a $SiO_2$ film 16 between the Si substrate 10 and the $TiO_2$ film 11. Also in this case, extra oxygen in the $TiO_2$ film 11 diffuses in the Si film 28 formed on the side of the $TiO_2$ film 11 to reduce the thickness of the $SiO_2$ film 16 between the Si substrate 10 and the $TiO_2$ film 11.

Figure 30:
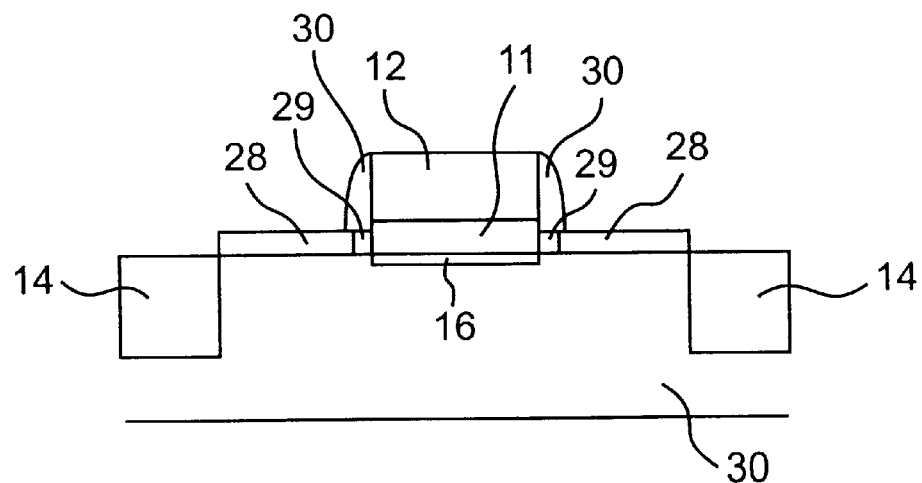

Next, as shown in FIG. 30, a SiN film is deposited on the whole surface and is subjected to an RIE (reactive ion etching) to form SiN gate side walls 30. Sometimes, impurities of As or $BF_2$ are introduced at this time and then a heat treatment is performed to form deep source/drain regions in the parts separate from the gate.

Figure 31:
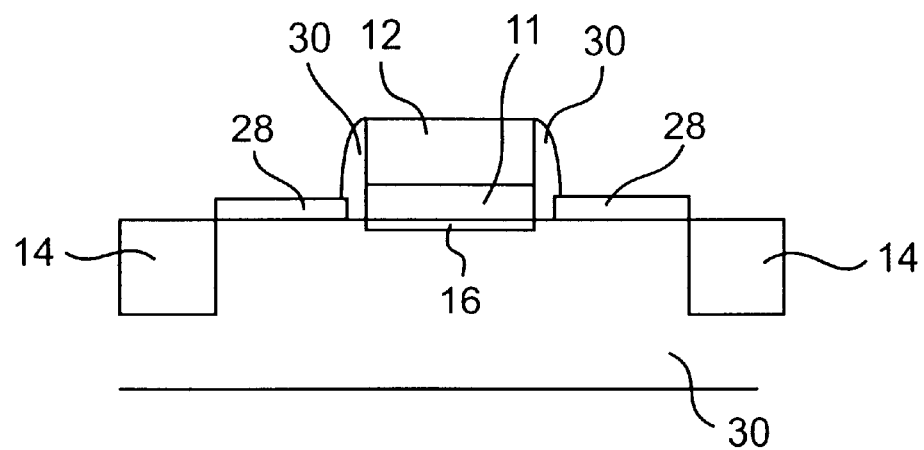

Also, as shown in FIG. 31, it is preferred that, after the process shown in FIG. 29, the $SiO_2$ film 29 formed on the Si film 28 be etched away to form SiN gate side walls 30. This is because the $SiO_2$ film 29 is formed only by the extra oxidizing agent in the $TiO_2$ film 11 and hence there is a possibility that insulation is not sufficient depending on the conditions.

The following processes are performed in the same way as is used in the preferred embodiment 1 to form a field effect transistor. Also in the transistor formed in this manner, it is possible to thin the $SiO_2$ film right under the gate insulating film having a high dielectric constant and to improve the driving force of the transistor.

Also in the preferred embodiment, the material of the film 28 formed on the side of the gate insulating film 11 is not necessarily limited to Si, but it is possible to use a material selectively deposited and to be oxidized, such as W, Al, Cu, or $TiSi_2$ or stacking film of thereof. Also, these materials are arranged finally only on the source/drain regions and even if they are arranged on the whole surface when they are deposited, they are preserved only on the source/drain regions by the following processes. Also, it is possible that the sidewall of $SiO_2$ or SiN is formed before the film 28 is formed.

(Embodiment 8)

Next, a method for manufacturing a semiconductor device of the eighth preferred embodiment in accordance with the present invention is described below in conjunction with FIG. 32, which is a cross-sectional view of the semiconductor device.

Figure 32:
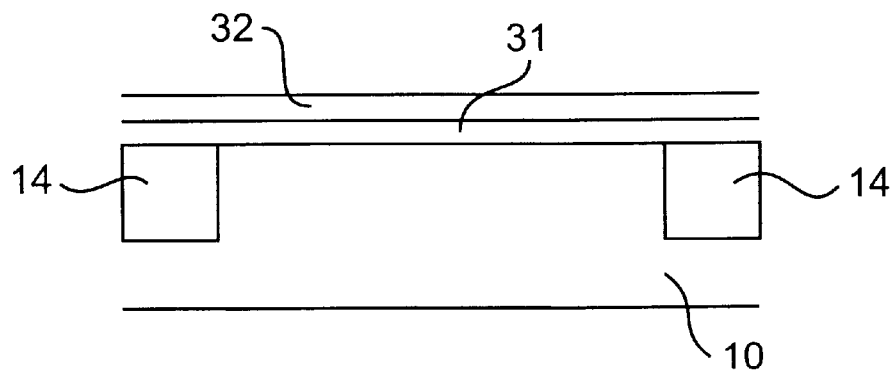
FIG. 32 is a cross-sectional view of a semiconductor device showing a method for manufacturing the semiconductor device of the eighth preferred embodiment in accordance with the present invention.

First, as shown in FIG. 32, a trench having a depth of about 0.4 μm for an STI (shallow trench isolation) is made on a Si substrate 10 and then a $SiO_2$film is deposited on the whole surface of the Si substrate 10 by a CVD method. Then the whole surface is planarized by a CMP (chemo-mechanical polishing) method to form a device-isolating region 14.

Next, a mixed gas of TPT (tetra-iso-propyltitanate) (Ti $(OC_3H_7)_4$) and oxygen is flown and is reacted at a substrate temperature of 380° C. to deposit $TiO_2$ films 31 and 32 to be a gate insulating film on the whole surface with a thickness of 30 nanometers. At this time, the $TiO_x$ film 31 has a composition of Ti:O=1:1.9 which is slightly enriched by Ti, compared with a composition of Ti:O=1:2, and the $TiO_x$ film 32 has a composition of Ti:O=1:2, or a composition slightly enriched by oxygen.

Next, a heat treatment is performed to densify the $TiO_x$ films. When the $TiO_x$ films are subjected to the heat treatment, the not-yet-reacted oxygen in the $TiO_x$ films 31 and 32 bonds to Ti having not-yet-reacted bonds and is inactivated. Therefore, the growth of the Si oxide film between the $TiO_x$ film 31 and the Si substrate 10 is prevented. A ratio between the $TiO_x$ films 31 and 32 are freely determined. It is preferable that a film enriched by Ti is near the Si substrate 10, but even if the $TiO_x$ films 31 and 32 are arranged in a reverse order, they can be effective.

Also, it is possible to slightly enrich the film as a whole with Ti. However, it is not desirable that a composition of the film is much enriched with Ti because a leakage current passing through the $TiO_x$ films is produced. Therefore, it is preferable that the composition is near to a ratio of Ti:O=1:2. Of course, it is preferable in the state where there is no not-yet-reacted $O_2$ molecule that the composition is a ratio of Ti:O=1:2.

Then, the following processes are performed according to the above-described processes for manufacturing a transistor to manufacture a field effect transistor in accordance with the present invention. Also in the transistor formed in this manner, it is possible to thin the $SiO_2$ film right under the gate insulating film having a high dielectric constant and to improve the driving force of the transistor.

(Embodiment 9)

Next, a method for manufacturing a semiconductor device of the ninth preferred embodiment in accordance with the present invention is described below in conjunction with FIGS. 33 to 35, which are cross-sectional views of the semiconductor device.

Figure 33:
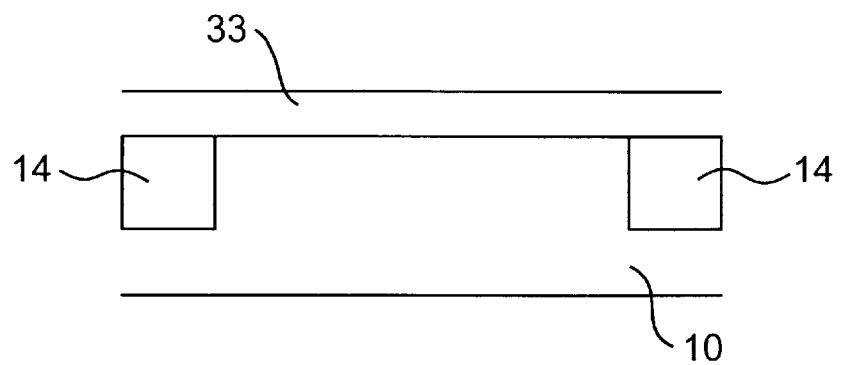
FIGS. 33–35 are cross-sectional views of a semiconductor device showing a method for manufacturing the semiconductor device of the ninth preferred embodiment in accordance with the present invention.

First, as shown in FIG. 33, a trench having a depth of about 0.4 μm for an STI (shallow trench isolation) is made on a Si substrate 10 and then a $SiO_2$ film is deposited on the whole surface of the Si substrate 10 by a CVD method. Then the whole surface is planarized by a CMP (chemo-mechanical polishing) method to form a device-isolating region 14.

Next, a mixed gas of TPT (tetra-iso-propyltitanate) (Ti $(OC_3H_7)_4$) and oxygen is flown and is reacted at a substrate temperature of 380° C. to deposit a $TiO_2$ film 33 to be a gate insulating film on the whole surface with a thickness of 30 nanometers.

Figure 34:
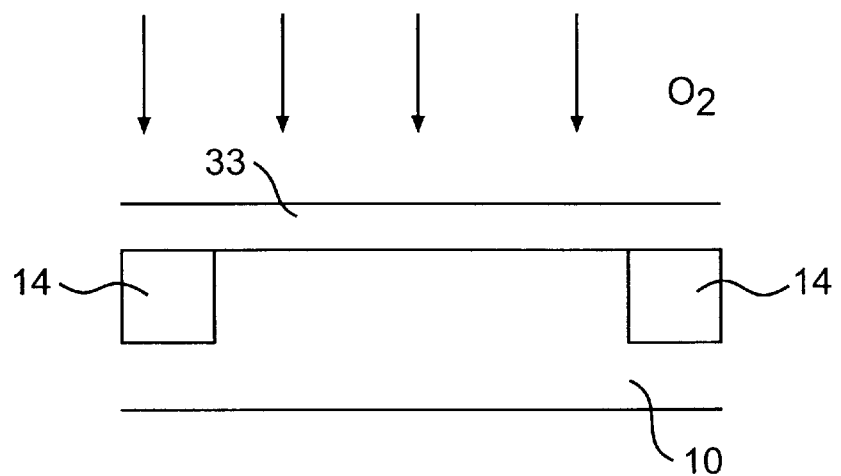

Next, as shown in FIG. 34, $O_2$ ions are introduced into the whole surface by 1E13 cm-2 at 5 KeV by an ion implantation to cut a Ti—O bond in the film.

Figure 35:
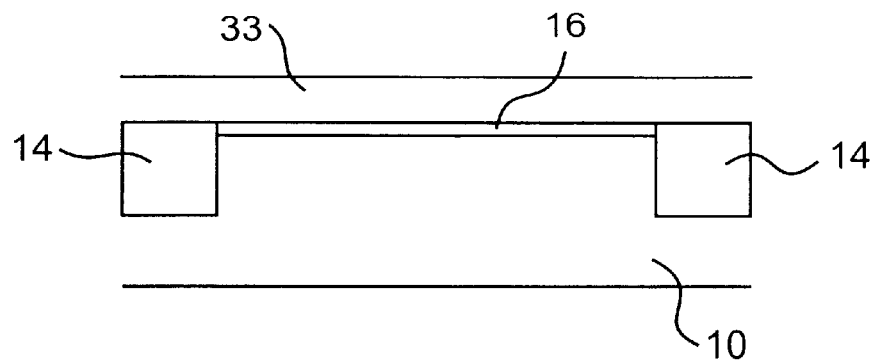

Next, as shown in FIG. 35, a heat treatment is performed at 750° C. for 30 minutes in an inert gas atmosphere to recover the Ti—O bond. At this time, almost all the not-yet-reacted $O_2$ existing in the film and the ion-implanted $O_2$ bond to Ti and are inactivated. This prevents the reaction of $O_2$ with the Si substrate 10, which results in forming an extremely thin $SiO_2$ film 16 at the interface. When a process advances from the process of forming a gate electrode, all the $O_2$ completely reacts with Ti or Si in this process and hence the thickness of an oxide film formed at the interface does not increase in the following heating process. The ions used for ion implantation for cutting the Ti—O bond is not limited to $O_2$, but $N_2$, Ar or $F_2$ may be used, for example.

Then, a field effect transistor is manufactured according to the conventional processes for manufacturing a transistor. Also in the transistor formed in this manner, it is possible to thin the Si oxide film right under the gate insulating film having a high dielectric constant and to improve the driving force of the transistor.

(Embodiment 10)

Next, a method for manufacturing a semiconductor device of the tenth preferred embodiment in accordance with the present invention is described below in conjunction with FIGS. 36 to 39, which are cross-sectional views of the semiconductor device.

Figure 36:
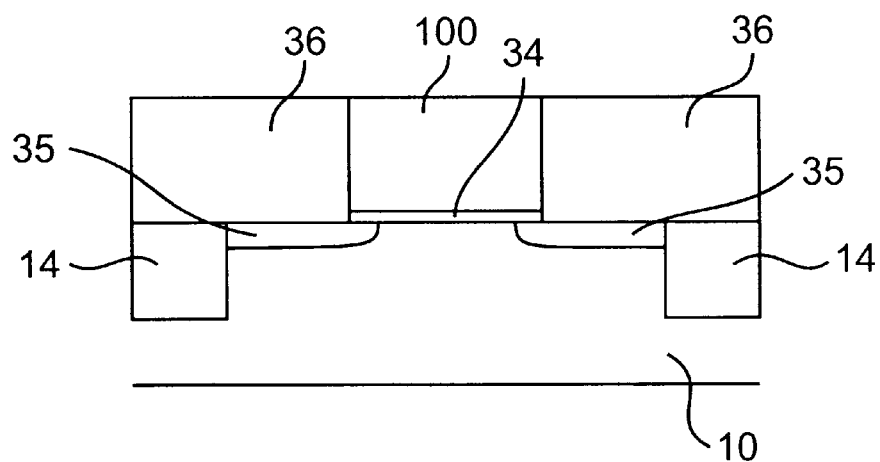
FIGS. 36–39 are cross-sectional views of a semiconductor device showing a method for manufacturing the semiconductor device of the tenth preferred embodiment in accordance with the present invention.

First, as shown in FIG. 36, a trench having a depth of about 0.4 μm for an STI (shallow trench isolation) is made on a Si substrate 10 and then a $SiO_2$ film is deposited on the whole surface of the Si substrate 10 by a CVD method. Then the whole surface is planarized by a CMP (chemo-mechanical polishing) method to form a device-isolating region 14.

Next, the Si substrate 10 is subjected to oxidation by a chloric acid at a treatment temperature of 750° C. for 30 minutes to form a Si oxide film 34 on the whole surface. Then, polycrystalline Si is deposited on the whole surface with a thickness of 200 nanometers and then is processed by a lithography process and an RIE (reactive ion etching) such that a Si oxide film 34 and the polycrystalline Si 100 remain at the part where a gate is to be formed.

Next, ions are implanted into source/drain regions 35. Further, a Si oxide film 36 is deposited on the whole surface and then is subjected to an annealing treatment for activation, for example, at 800° C. for 30 minutes, and then is etched away by the CMP method until the polycrystalline Si 100 is exposed and then the polycrystalline Si is etched away by a plasma etching in a $CF_4$ atmosphere.

Figure 37:
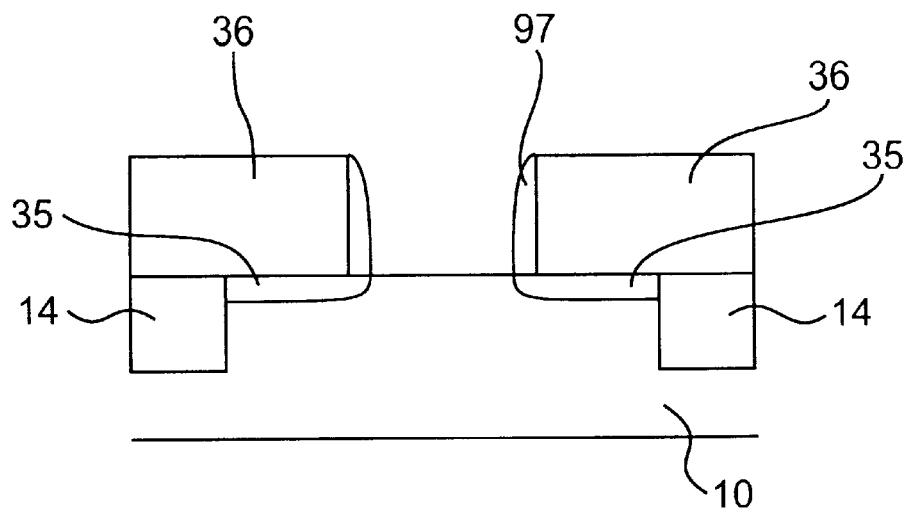

Next, as shown in FIG. 37, a Si layer is deposited on the whole surface with a thickness of 5 nanometers and then Si side walls 37 are left by a side wall leaving process and then the Si oxide film 34 except for the Si side walls 37 are removed by the use of a liquid containing a hydrofluoric acid.

Figure 38:
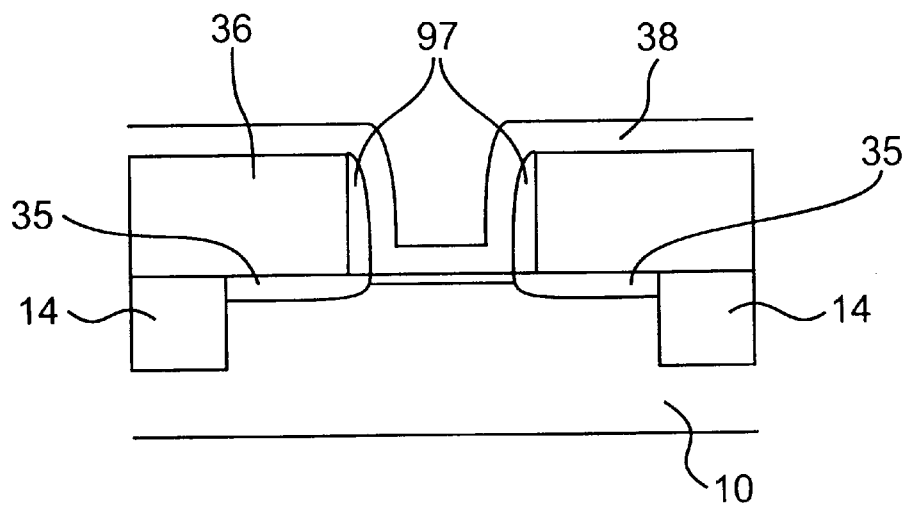

Next, as shown in FIG. 38, a $TiO_2$ film 38 is deposited on the whole surface with a thickness of 30 nanometers and is subjected to an annealing treatment at 800° C. for 30 minutes in an Ar atmosphere to densify the $TiO_2$ film 38. All the side walls are transformed into a Si oxide film 97 by the reaction of the Si side walls 37 with not-yet-reacted O2. This prevents the growth of the Si oxide film at the interface between the $TiO_2$ film 38 and the Si substrate. Also, the annealing treatment for densifying the $TiO_2$ film 38 is not necessarily performed just after the $TiO_2$ film is deposited, but it may be performed after any following process.

Figure 39:
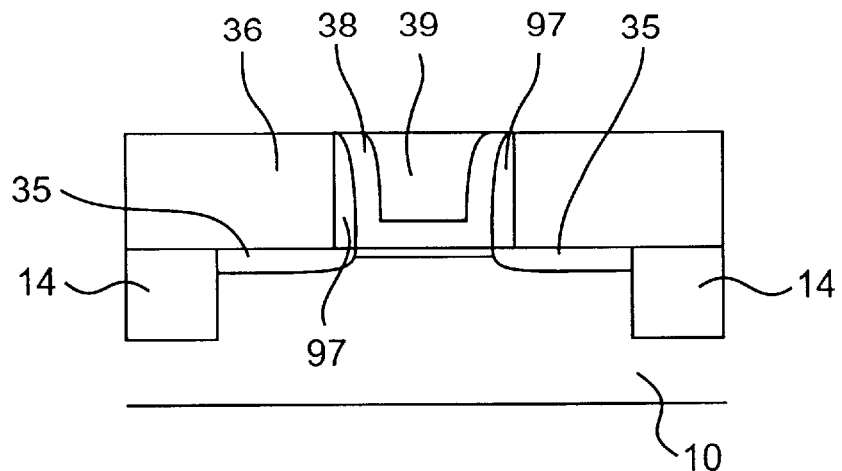

Next, as shown in FIG. 39, metal to be a gate electrode 39 such as Pt is deposited on the whole surface and is subjected to a CMP process to form a field effect transistor.

Figure 40:
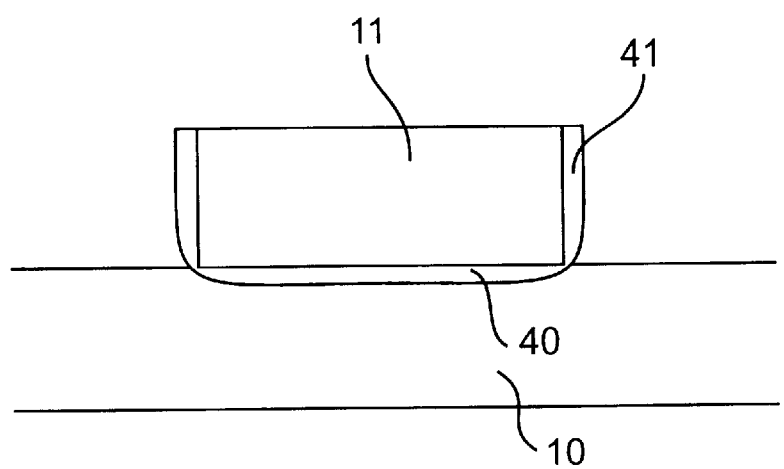
FIG. 40 is an enlarged cross-sectional view of a MOS interface of a field effect transistor formed in the third to seventh and tenth preferred embodiments in accordance with the present invention.

FIG. 40 is an enlarged cross-sectional view of the MOS interface of the field effect transistor formed in the preferred embodiments 3 to 7 and 10 in accordance with the present invention.

Since the not-yet-reacted $O_2$ in the $TiO_2$ gate insulating film 11 having a high dielectric constant is reacted from the sides of the gate insulating film 11 to form a Si oxide film 40, 41 the thickness of the Si oxide film 40 at the interface between the gate insulating film 11 and the Si substrate 10 has a structure in which the thickness is not uniform but is thick in the center and thin at both ends.

A device having a narrow gate width like a cell transistor of a conventional DRAM has a problem of a narrow channel effect. The narrow channel effect means an effect that impurities doped right under a device-isolating oxide film ooze to increase the threshold voltage of a transistor when devices are isolated by a LOCOS method. In the present invention, the thickness of the Si oxide film is thinned at the ends of the gate and hence the threshold voltage is reduced at the ends, compared with the other portion, which can prevent the narrow channel effect.

This effect is described in conjunction with FIGS. 41 and 42. In a conventional transistor, a threshold voltage at portions shown by a symbol O in the drawing is increased because a profile is not uniform in the direction of width of a gate. Therefore, if the width of the gate is particularly short, a threshold voltage is increased, which is called a narrow channel effect. This presents a big problem in designing a LSI (DRAM and LOGIC) having various widths of the gate.

The present invention can reduce the thickness of the Si oxide film right under the gate insulating film having a high dielectric constant at the end portions, shown by a symbol O, of the gate and can prevent an increase in threshold voltage at the portions. This can prevent the narrow channel effect. As is shown in the right graph in FIG. 41, a transistor in accordance with the present invention does not show an increase in threshold voltage even when the width of the gate is short.

Also, according to the present invention, the thickness of the Si oxide film right under the highly dielectric gate insulating oxide film is thinned at the ends in the direction of the length of the gate and hence source/drain are positioned at the ends of the gate or a slightly apart outside, which produces an effect of keeping low parasitic resistance.

This effect is described using FIG. 42. In the case where the length of a gate is small, for example, about 0.1 $\mu$m, in order to reduce the so-called narrow channel effect, the source/drain are designed such that they are as shallow as possible and further are not needlessly embedded under the gate. At this time, if there is no margin in the process conditions, as shown in FIG. 42, the source/drain have the so-called offset structure in which the source/drain are separate from the ends of the gate. On the other hand, according to the present invention, since the thickness of the Si oxide film can be thinned at the ends of the gate, semiconductor surface potential generated by a gate voltage can substantially be changed at the ends of the gate (can be reduced in the case of an n-channel MOS), which can prevent an increase in parasitic resistance at the ends of the gate. In this manner, as shown in the right-hand graph in FIG. 42, the present invention produces an effect of keeping the drain current of the transistor at a high level.

Figure 43:
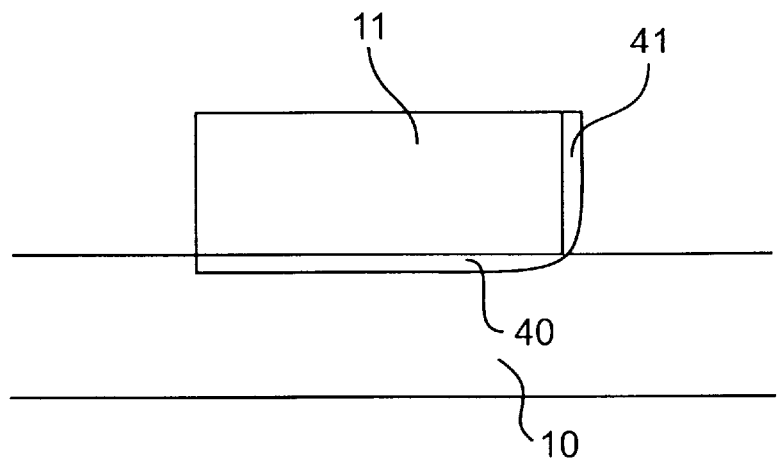
FIG. 43 is an enlarged cross-sectional view of a MOS interface of a field effect transistor in accordance with the present invention.
Figure 44:
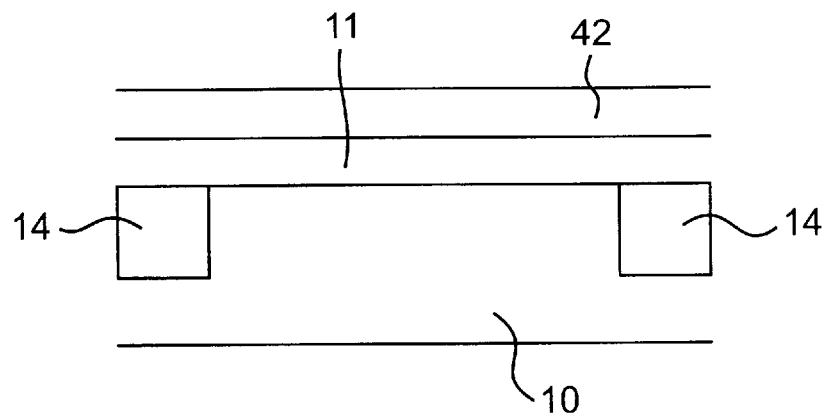
FIGS. 44–49 are cross-sectional views of a semiconductor device showing a method for manufacturing the semiconductor device of the eleventh preferred embodiment in accordance with the present invention.

These effects are produced even by a structure shown in an enlarged cross-sectional view of a MOS interface of a field effect transistor of FIG. 43, a Si oxide film 40, 41 is formed and in which the gate insulating film having a high dielectric constant is formed only at one side end of the gate. This structure can be formed by forming the Si film in the preferred embodiment 3 on the whole surface of the declined Si substrate 10 by a highly anisotropic deposition method such as evaporating or sputtering to form the Si film only on one side of the gate insulating film having a high dielectric constant and then by subjecting the Si substrate to a heat treatment.

(Embodiment 11)

Next, a method for manufacturing a semiconductor device of the eleventh preferred embodiment in accordance with the present invention is described below with reference to FIGS. 4 to 49, which are cross-sectional views of the semiconductor device.

First, a trench having a depth of about 0.4 $\mu$m for an STI (shallow trench isolation) is made on a Si substrate 10 and then a SiO$_2$ film is deposited on the whole surface of the Si substrate 10 by a CVD method. Then the whole surface is planarized by a CMP (chemo-mechanical polishing) method to form a device-isolating region 14.

Next, a mixed gas of TPT (tetra-iso-propyltitanate) (Ti(OC$_3$H$_7$)$_4$) and oxygen is flown and is reacted at a substrate temperature of 380° C. to deposit a TiO$_2$ film 11 to be a gate insulating film on the whole surface with a thickness of 30 nanometers. Next, a Si film 42 for absorbing oxygen in the TiO$_2$ film 11 is deposited on the whole surface. The Si film 42 may be polycrystalline or amorphous.

Figure 45:
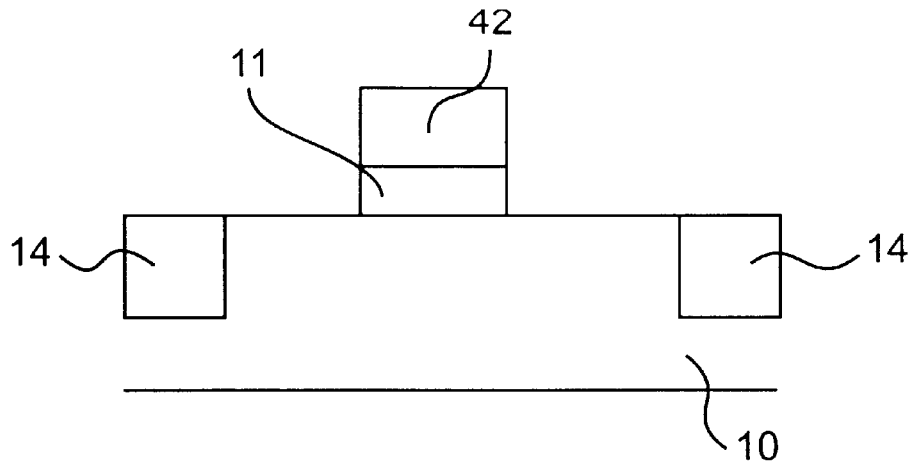

Next, as shown in FIG. 45, a gate electrode position is defined by the use of a lithography technique, and then the Si film and TiO$_2$ film are etched away to the Si substrate 10 by a reactive ion etching by the use of a chlorine-based etching gas (for example, a BCl$_3$ gas, or a mixed gas of a BCl$_3$ gas and an HBr gas).

Figure 46:
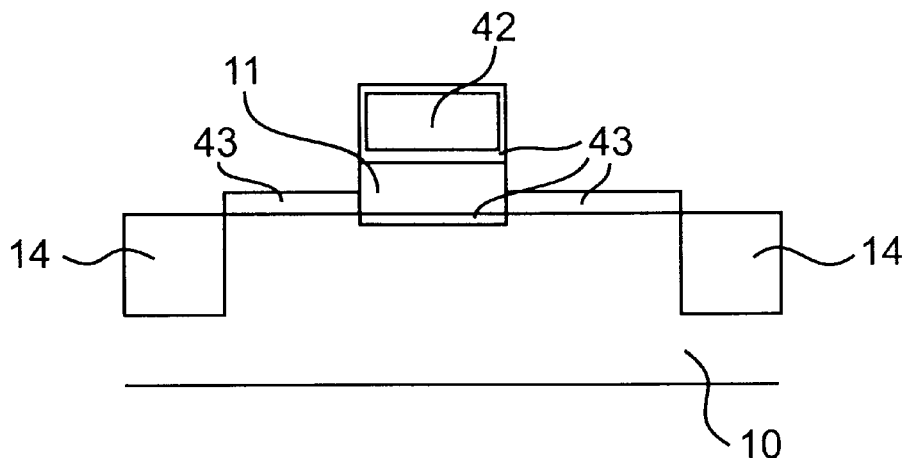

Next, as shown in FIG. 46, in order to densify the TiO$_2$ film 11, the TiO$_2$ film 11 is oxidized, for example, at 800° C. for 30 minutes in a dry oxygen atmosphere. At this time, an interface between the TiO$_2$ film 11 and the Si substrate 10 and an interface between the TiO$_2$ film 11 and the upper Si film 42 are also oxidized to form a Si oxide film 43. Since oxygen is diffused in this way not only between the TiO$_2$ film 11 and the Si substrate 10 but also between the TiO$_2$ film 11 and the polycrystalline Si film 42, the Si oxide film is formed in a thin thickness.

Figure 47:
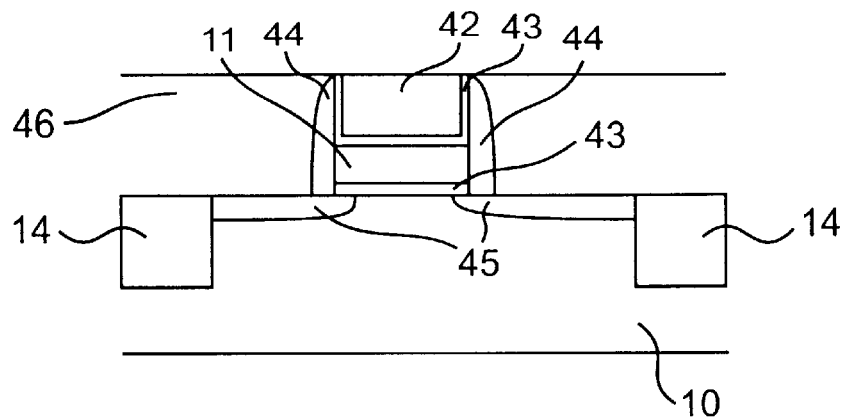

Next, as shown in FIG. 47, gate side walls 44 made of SiN are formed and the substrate 10 is doped with impurities to form source/drain regions 45. The thickness of the oxide film at the interface between the TiO$_2$ film 11 and the upper and lower Si film tends to become larger. Further, a SiO$_2$ film 46 is deposited on the whole surface by a CVD method and then is polished by a CMP process until the polycrystalline Si film 42 is exposed to the surface at a gate portion.

Figure 48:
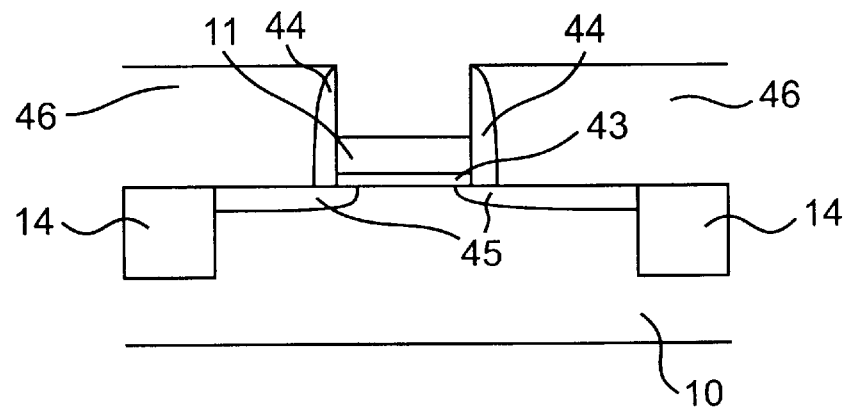

Next, as shown in FIG. 48, the polycrystalline Si film 42 is removed by the use of a gas such as a CF$_4$ plasma gas and then the Si oxide film 43 on the TiO$_2$ film 11 is removed by a solution containing HF.

Figure 49:
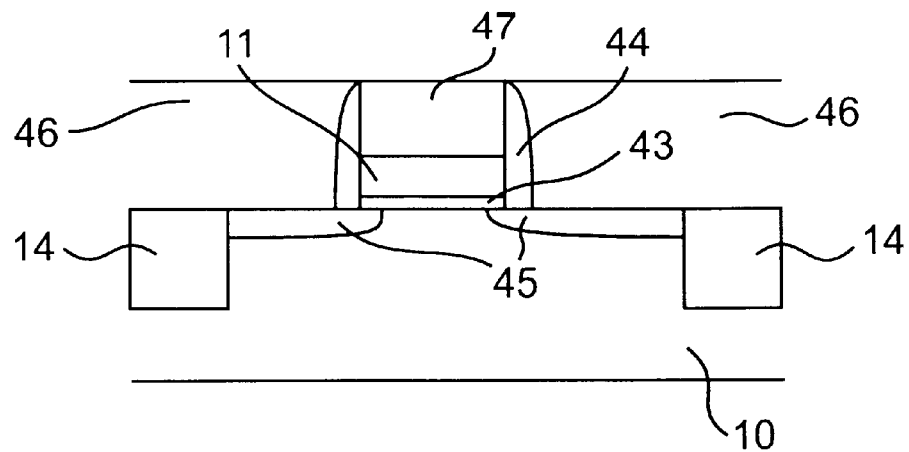

Next, as shown in FIG. 49, Pt or the like is buried in the place where the polycrystalline Si film existed to form a gate electrode 47. Also in a MOSFET formed in this way, the Si oxide film formed right under the gate insulating film 11 having a high dielectric constant is formed with a thin thickness and hence the driving force of the device is improved.

Although the TiO$_2$ film is used as the highly dielectric film 11, it is not necessary to limit the highly dielectric film 11 to the TiO$_2$ film. For example, a Ta$_2$O$_5$ film, an Al$_2$O$_3$ film, a Y$_2$O$_3$ film, a ZrO$_2$ film, or a (Ba, Sr) TiO$_3$ film may be used as the highly dielectric film. Also, although the TiO$_2$ film 11 is formed by the MOCVD method, it may be formed by a sputtering method. Also, when the TiO$_2$ film 11 is deposited, an Xe lamp of 200 W may be operated to apply near-ultraviolet rays having a wavelength of 300 nanometers to the whole surface of the wafer through the window of a deposition apparatus. The lamp is operated before a deposition gas is flown and constantly applies the near-ultraviolet rays until the deposition finishes. This can prevent the mixture of C and H from an organic source gas and can deposit a film having a composition completely consisting of TiO$_2$.

Also, it is not necessary to limit a raw material gas for the MOCVD to the combination of gases described above, but a mixed gas of TET (ethyltitanate) (Ti(OC$_2$H$_5$)$_4$) or TTIP (titanium-tetrakis-isopropoxide) and oxygen may be used, for example. When the TTIP is used, even if it is not mixed with oxygen, it can form the $TiO_2$ film. Also, instead of the organic source, an inorganic source such as $TiCl_4$ may be used for deposition. In this case, however, it is preferable to set a reaction temperature at a slightly high temperature, for example, at about 600° C. It is not necessary to limit a method for depositing the Si film 42 to the CVD method, but the sputtering method may be used, for example. Also, it is not necessary to limit a material of a layer for absorbing an oxidizing agent to the polycrystalline Si, but a material may be used which does not reduce the $TiO_2$ but reacts with oxygen; for example, C, Ta, W, Mo and the like may be used.

Also, it is preferred that impurities such as As, B, or P be contained in a level of about $1 \times 10^{21} cm^{-3}$ to facilitate the oxidation of the polycrystalline Si. Further, since it is known that polycrystalline Si mixed with hydrogen actively reacts with $TiO_2$, it is also effective to use this reaction. Still further, while SiN is used for the gate side wall in the present preferred embodiment, it is also possible to absorb oxygen from the side of the $TiO_2$ film by the use of a material absorbing oxygen more than the SiN. In this case, however, it is necessary for keeping the insulation of each electrode that the absorbing material is completely oxidized to show insulation. Further, it is not necessary to limit the material of the gate electrode to Pt, but it is preferable to use a material which does not reduce a highly dielectric material and resists reacting with oxygen, that is, a single metal such as Au, and a metallic silicide such as $TiSi_2$, $MoSi_2$, $WSi_2$ and the like, and a compound alloy such as TiN. Also, it has been described that the $TiO_2$ film is deposited directly on the Si in the present preferred embodiment, but an insulating film such as a $TiO_2$ film, a SiN, film, and the like may be deposited before the $TiO_2$ film is deposited. Also, an oxide film, a SiN film, or the other material film may be deposited before the polycrystalline Si is deposited.

(Embodiment 12)

Next, a method for manufacturing a semiconductor device of the twelfth preferred embodiment in accordance with the present invention is described below with reference to FIGS. 50 to 54, which are cross-sectional views of the semiconductor device.

Figure 50:
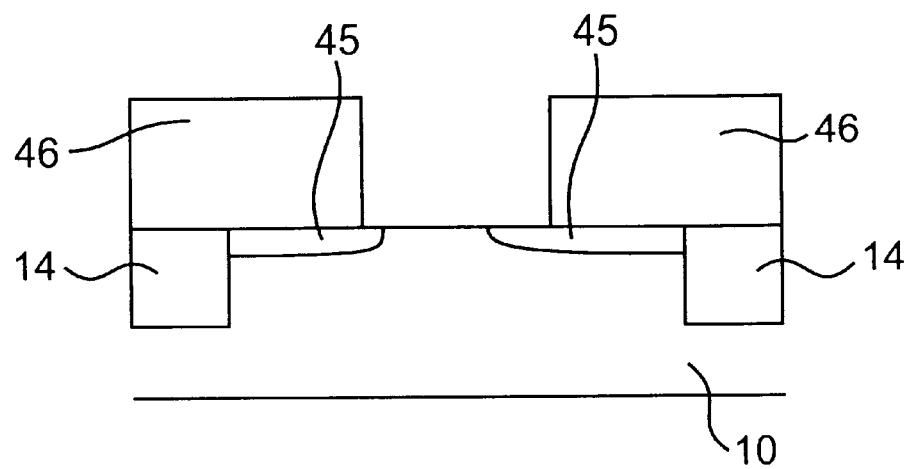
FIGS. 50–54 are cross-sectional views of a semiconductor device showing a method for manufacturing the semiconductor device of the twelfth preferred embodiment in accordance with the present invention.

First, as shown in FIG. 50, a trench having a depth of about 0.4 $\mu$m for a STI (shallow trench isolation) is made on a Si substrate 10 and then a $SiO_2$ film is deposited on the whole surface of the Si substrate 10 by a CVD method. Then the whole surface is planarized by a CMP (chemo-mechanical polishing) method to form a device-isolating region 14.

Next, the substrate is oxidized by a chloric acid at a substrate temperature of 750° C. for 30 minutes to form a Si oxide film on the whole surface thereof and to form a polycrystalline Si film with a thickness of 200 nanometers on the whole surface. Next, the Si oxide film and the polycrystalline Si film are processed by a photolithography process and a RIE such that they remain in a region forming a gate and then ions are implanted into source/drain regions 45. Next, an oxide film 46 is deposited on the whole surface by the CVD method and then is subjected to an annealing for activation, for example, at 800° C. for 30 minutes. Further, it is etched away by the CMP method until the polycrystalline Si film is exposed and then the polycrystalline Si film is etched away by a plasma etching in a $CF_4$ atmosphere. Thereafter, the Si oxide film is also etched away.

Figure 51:
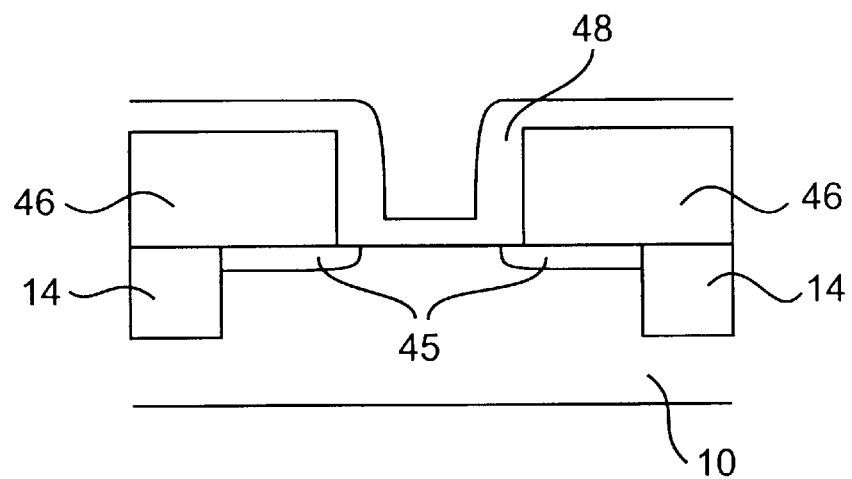

Next, as shown in FIG. 51, a $TiO_2$ film 48 is deposited with a thickness of 30 nanometers on the whole surface.

Figure 52:
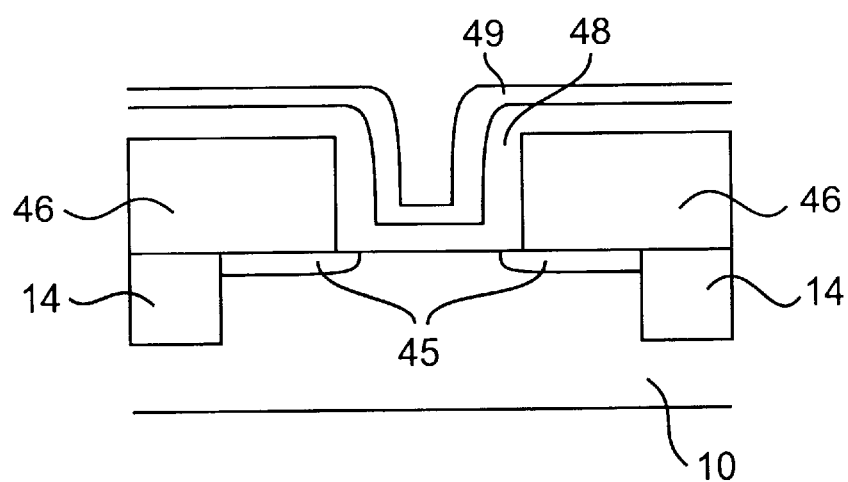

Next, as shown in FIG. 52, a polycrystalline or amorphous Si film 49 is deposited, for example, with a thickness of 30 nanometers on the whole surface.

Figure 53:
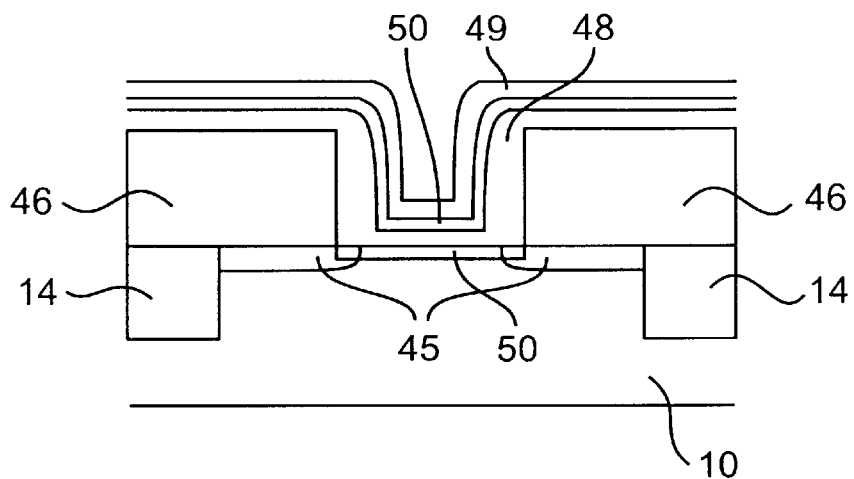

Next, as shown in FIG. 53, the Si substrate 10 is subjected to an annealing treatment at 800° C. for 30 minutes in an Ar atmosphere to densify the $TiO_2$ film 48. At this time, a Si oxide film 50 is formed at the interface by the reaction of the Si film 49 with not-yet-reacted $O_2$ in the $TiO_2$ film 48. This prevents the growth of the Si oxide film 50 at the interface between the Si substrate 10 and the $TiO_2$ film 48. This densifying process may be performed in a dry oxygen atmosphere.

Figure 54:
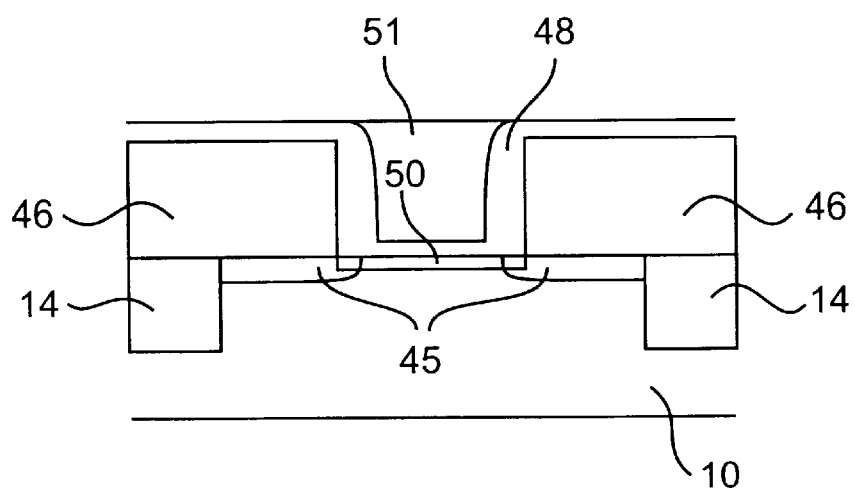

Next, as shown in FIG. 54, the polycrystalline Si film 49 is removed by $CF_4$ plasma and the Si oxide film 50 under the polycrystalline Si film 49 is removed by a HF process. Further, Pt or the like is buried in a gate region to form a gate electrode 51. Since it is possible to thin the Si film right under the gate insulating film having a high dielectric constant also in a MOSFET formed in this manner, the driving force of the device is improved.

In the preferred embodiment, the $TiO_2$ film is deposited on the bare Si after the oxide film is removed, but it is also possible to deposit $SiO_2$ or SiN before the $TiO_2$ film is deposited. Further, it is also possible to deposit $SiO_2$ or SiN before the Si film is deposited on the $TiO_2$ film. Of course, the process of removing the insulating film on the $TiO_2$ film includes the removal of these inserted layers.

(Embodiment 13)

Next, a method for manufacturing a semiconductor device of the thirteenth preferred embodiment in accordance with the present invention is described below with reference to FIGS. 55 to 57, which are cross-sectional views of the semiconductor device.

Figure 55:
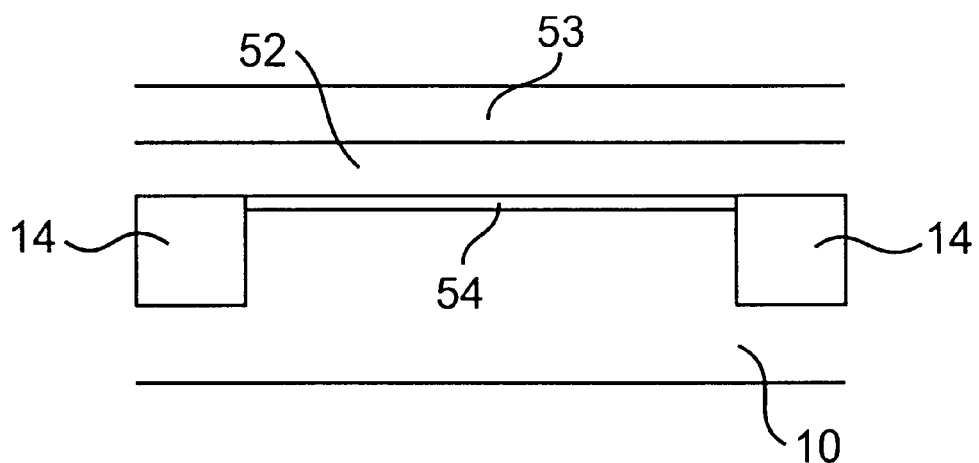
FIGS. 55–57 are cross-sectional views of a semiconductor device showing a method for manufacturing the semiconductor device of the thirteenth preferred embodiment in accordance with the present invention.
Figure 56:
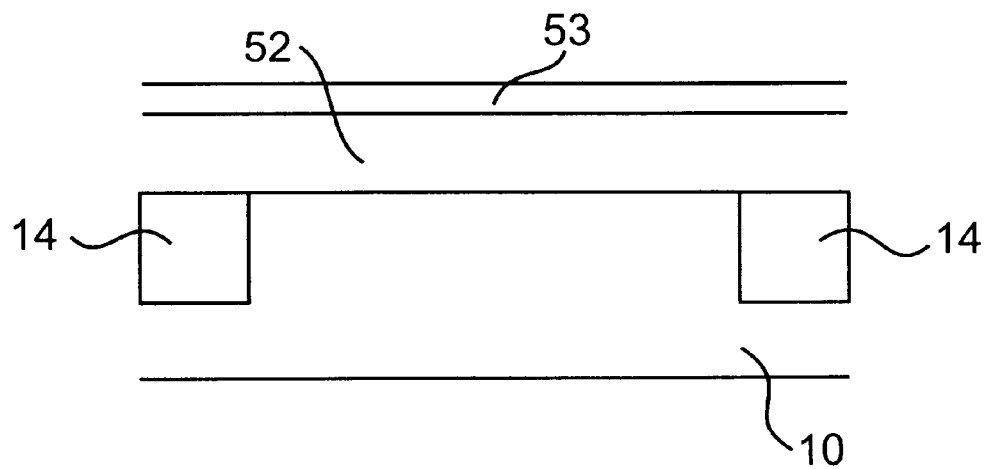

First, as shown in FIG. 55, a trench having a depth of about 0.4 $\mu$m for an STI (shallow trench isolation) is made on a Si substrate 10 and then a $SiO_2$ film is deposited on the whole surface of the Si substrate 10 by a CVD method. Then the whole surface is planarized by a CMP (chemo-mechanical polishing) method to form a device-isolating region 14.

Next, a $ZrO_2$ film 52 to be a gate insulating film is deposited with a thickness of 10 nanometers on the whole surface by the LPCVD method at a substrate temperature of 300° C. or more by using $Zr(O-t-C_2H_9)_4$ as a source. Then, a $ZrO_2$ film is deposited on the whole surface with a thickness of 10 nanometers as a material for absorbing oxygen in the $ZrO_2$ film 52.

Next, in order to densify the $ZrO_2$ film 52, the substrate is subjected to a heat treatment in an oxygen gas, a nitrogen gas, or an inert gas. Preferably, the temperature of the heat treatment is 500° C. or more. In this process, oxygen remaining not-yet-reacted in the $ZrO_2$ film 52 reacts with and is consumed by the Zr film 53 formed thereon, and the $SiO_2$ film 54 formed on the Si substrate 10 before the $ZrO_2$ film 52 is deposited is completely reduced to Si (see FIG. 56).

Figure 57:
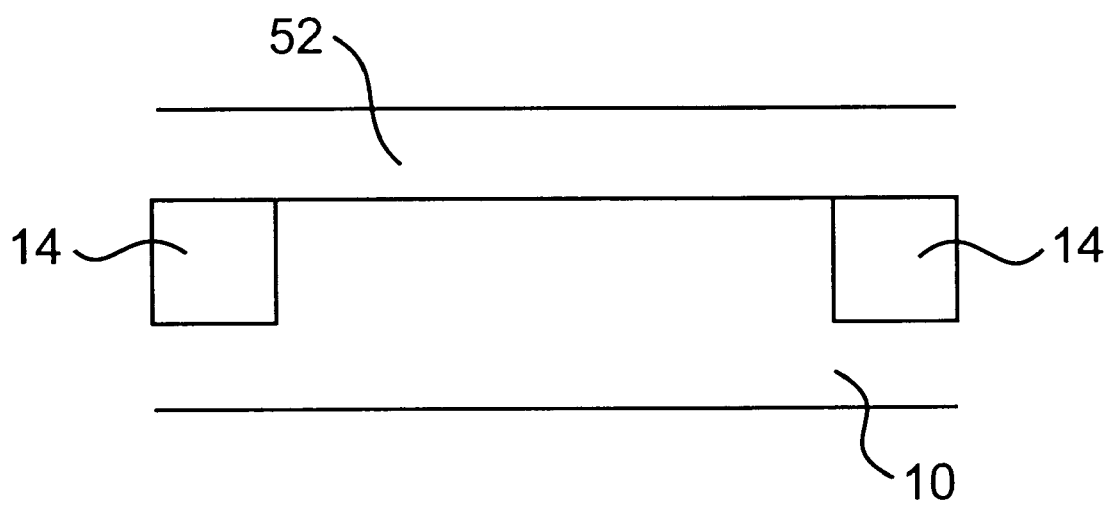

Next, as shown in FIG. 57, when Zr remains not-yet-reacted, it is removed by the use of a solution containing a hydrofluoric acid or a solution containing aqua regia, or a gas containing chlorine to form only the $ZrO_2$ film 52 on the Si substrate 10. Since there is a possibility that the $ZrO_2$ film 52 is partially removed by the solution, it is effective to increase the thickness of the $ZrO_2$ film 52 slightly. Next, a MOSFET is formed by a process as described above. The MOSFET formed in this way also has a thin Si oxide film or almost no Si oxide film right under the gate insulating film having a high dielectric constant and hence the driving force of the device is improved.

In the preferred embodiment, the $ZrO_2$ film has been described as an example, but it is not intended to limit a gate insulating film to the ZrO$_2$ film and Al$_2$O$_3$, Hf oxide or other metallic oxide (TiO$_2$) may be used. It is needless to say that the removing gas or a solution is different depending on the material. However, it is not preferable that a material producing an oxide having a medium composition ratio (for example, Mox: x=0.1, 1.7, which does not show plain stoichiometry) or a material incapable of reducing SiO$_2$ is used as a material in the present preferred embodiment. Of course, a method of depositing these materials is not limited to the CVD method, but an evaporating method or a sputtering method may be used. The SiO$_2$ film formed before the ZrO$_2$ film is deposited is completely removed, but it may partially remain. Also, silicade represented ZrSixOy may be formed.

The present invention makes it possible to thin a Si oxide film formed right under a gate insulating film when a highly dielectric gate insulating film and a gate electrode of a MIS transistor in the 0.1 µm generation are formed. Also, the present structure in which the gate oxide film is thin at the ends of the gate can prevent a narrow channel effect which is a substantial problem in a device having a narrow gate width and can produce an effect of reducing the parasitic resistance of a transistor whose source/drain regions agree with or are apart outside from the ends of the gate.

What is claimed is:

1. A semiconductor device comprising:
   a silicon substrate;
   a gate insulating film made of a metallic oxide film having an edge and a center and formed over said silicon substrate;
   a gate electrode formed over said gate insulting film; and
   an interface film formed between said gate insulating film and said silicon substrate, wherein said interface film is thinner under said edge of said gate insulating film than under said center of said gate insulating film.

2. A semiconductor device according to claim 1 wherein said gate insulating film is made of ZrO$_2$.

3. A semiconductor device according to claim 1 wherein said gate insulating film is made of Y$_2$O$_3$.

4. A semiconductor device according to claim 1 wherein said gate insulating film is made of Al$_2$O$_3$.

5. A semiconductor device according to claim 1 wherein said gate insulating film is made of TiO$_2$.

6. A semiconductor device according to claim 1 wherein said gate electrode made of at least one material selected form a single metal, a metallic silicide and a compound alloy.

7. A semiconductor device according to claim 1 wherein said gate electrode made of at least one material selected form Au, TiSi$_2$, MoSi$_2$, WSi$_2$ and TiN.

8. A semiconductor device according to claim 1 further comprising, a SiN$_x$ film formed between said interface film and said gate insulating film.

9. A semiconductor device according to claim 1 further comprising, a SiON film formed on the side of the gate insulating film.

10. A semiconductor device according to claim 1 wherein said gate insulating film including N$_2$, Ar or F$_2$.

11. A semiconductor device comprising:
    a silicon substrate;
    a gate insulating film made of a metallic oxide film and formed over said silicon substrate; and
    a gate electrode formed over said gate insulating film, wherein, in a part of said gate insulating film, the ratio of metal to oxygen is larger than a stoichiometric ratio.

12. A semiconductor device according to claim 2 wherein said gate insulating film is made of ZrO$_2$.

13. A semiconductor device according to claim 2 wherein said gate insulating film is made of Y$_2$O$_3$.

14. A semiconductor device according to claim 2 wherein said gate insulating film is made of Al$_2$O$_3$.

15. A semiconductor device according to claim 2 wherein said gate insulating film is made of TiO$_2$.

16. A semiconductor device according to claim 2 wherein said gate electrode made of at least one material selected form a single metal, a metallic silicide and a compound alloy.

17. A semiconductor device according to claim 2 wherein said gate electrode made of at least one material selected form Au, TiSi$_2$, MoSi$_2$, WSi$_2$ and TiN.

18. A semiconductor device according to claim 2 further comprising, a SiN$_x$ film formed between said interface film and said gate insulating film.

19. A semiconductor device according to claim 2 further comprising, a SiON film formed on the side of the gate insulating film.

20. A semiconductor device according to claim 2 wherein said gate insulating film including N$_2$, Ar or F$_2$.

* * * * *

UNITED STATES PATENT AND TRADEMARK OFFICE
CERTIFICATE OF CORRECTION

PATENT NO.    : 6,326,670 B1
DATED         : December 4, 2001
INVENTOR(S)   : Akira Nishiyama et al.

It is certified that error appears in the above-identified patent and that said Letters Patent is hereby corrected as shown below:

Column 19,
Line 30, change "insulting" to -- insulating --.
Line 44, before "made" insert -- is --; and
Line 45, change "form" to -- from --.

Column 20,
Lines 2, 30 and 34, before "made" insert -- is --; and
Lines 3 and 31 and 35, change "form" to -- from --.
Lines 5, 8, 37 and 40, change "comprising," to -- comprising --.
Lines 11 and 43, change "including" to -- includes --.
Lines 21, 23, 25, 27, 29, 33, 36, 39 and 42, change "claim 2" to -- claim 11 --.

Signed and Sealed this

Second Day of July, 2002

*Attest:*

JAMES E. ROGAN
*Attesting Officer*           *Director of the United States Patent and Trademark Office*